US012601042B2

(12) United States Patent
Park

(10) Patent No.: US 12,601,042 B2
(45) Date of Patent: Apr. 14, 2026

(54) MASK FRAME ASSEMBLY AND METHOD OF MANUFACTURING THE SAME

(71) Applicant: Samsung Display Co., Ltd., Yongin-si (KR)

(72) Inventor: Sangha Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 305 days.

(21) Appl. No.: 18/314,988

(22) Filed: May 10, 2023

(65) Prior Publication Data

US 2023/0416902 A1 Dec. 28, 2023

(30) Foreign Application Priority Data

Jun. 23, 2022 (KR) ........................ 10-2022-0076730

(51) Int. Cl.
*C23C 14/04* (2006.01)
*H10K 71/16* (2023.01)

(52) U.S. Cl.
CPC ......... *C23C 14/042* (2013.01); *H10K 71/166* (2023.02)

(58) Field of Classification Search
CPC .... C23C 14/042; C23C 14/044; H10K 71/166
See application file for complete search history.

(56) References Cited

U.S. PATENT DOCUMENTS

| | | | |
|---|---|---|---|
| 8,550,032 B2 | 10/2013 | Park | |
| 8,631,761 B2 | 1/2014 | Kang | |
| 9,953,828 B2 | 4/2018 | Oh et al. | |
| 11,408,063 B2 | 8/2022 | Kim et al. | |
| 11,421,314 B2 | 8/2022 | Lee et al. | |
| 2010/0192856 A1* | 8/2010 | Sung | H10K 71/166 118/721 |
| 2016/0079532 A1* | 3/2016 | Yi | H10K 71/10 438/758 |
| 2019/0078193 A1* | 3/2019 | Lin | C23C 14/24 |

FOREIGN PATENT DOCUMENTS

| | | |
|---|---|---|
| KR | 1020100090070 A | 8/2010 |
| KR | 10-1107159 | 1/2012 |
| KR | 10-1659948 | 10/2016 |
| KR | 10-1833234 | 3/2018 |
| KR | 10-1897209 | 9/2018 |
| KR | 10-2020-0037024 | 4/2020 |
| KR | 1020200036998 A | 4/2020 |

* cited by examiner

*Primary Examiner* — Joseph A Miller, Jr.

(74) *Attorney, Agent, or Firm* — CANTOR COLBURN LLP

(57) ABSTRACT

A mask frame assembly includes a mask, a frame body, at least one support stick, and a fixing portion. The frame body includes a support portion supporting the mask and includes an opening through which the mask is exposed, and the at least one support stick supports the mask in the opening and is connected to the support portion by the fixing portion. An end of the at least one support stick is accommodated in at least one accommodation portion defined in the support portion. The at least one accommodation portion includes an accommodation groove and an insertion hole. The fixing portion is disposed between the at least one accommodation portion and the opening of the frame body. The end of the at least one support stick is stably connected to the support portion by the fixing portion and the at least one accommodation portion.

22 Claims, 20 Drawing Sheets

MASK FRAME ASSEMBLY AND METHOD OF MANUFACTURING THE SAME

CROSS-REFERENCE TO RELATED APPLICATION(S)

This application claims priority to and benefits of Korean Patent Application No. 10-2022-0076730 under 35 U.S.C. § 119, filed on Jun. 23, 2022 in the Korean Intellectual Property Office, the entire contents of which are incorporated herein by reference.

BACKGROUND

1. Technical Field

The disclosure relates to a mask frame assembly with improved reliability and a method of manufacturing the mask frame assembly.

2. Description of the Related Art

An organic light emitting display device may include an organic layer and/or an electrode formed by a vacuum deposition method. To manufacture the organic light emitting display device using the vacuum deposition method, a deposition mask, for example, a fine metal mask (FMM), through which openings are formed with the same pattern as that of a thin film to be formed on a substrate is tightly adhered to the substrate, and a deposition material is deposited on the substrate using the deposition mask. Thus, the thin film is formed with a desired pattern.

A light emitting display device may include pixels and a light emitting element disposed in each pixel. The light emitting element may include two electrodes and a light emitting layer disposed between the two electrodes. Light emitting layers disposed in the pixels may be grouped into plural groups.

A mask frame assembly may be used to deposit the light emitting layers on a work substrate. The light emitting layers that are patterned may be formed by placing the work substrate on the mask frame assembly and depositing a light emitting material on the work substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a mask frame assembly capable of improving reliability in coupling or connecting between a support stick and a frame body.

The disclosure provides a method of manufacturing the mask frame assembly.

Embodiments provide a mask frame assembly that may include a mask; a frame body; at least one support stick; and a fixing portion. The frame body may include a support portion supporting the mask and including with an opening through which the mask is exposed. The at least one support stick is disposed in the support portion of the frame body and supports the mask in the opening of the frame body. The support portion may include at least one accommodation portion in which an end of the at least one support stick is accommodated, and the fixing portion is disposed between the at least one accommodation portion and the opening of the frame body.

The at least one accommodation portion may include an accommodation groove recessed from an upper surface of the support portion toward a lower surface of the support portion and accommodating the end of the at least one support stick. The at least one accommodation portion may include a first insertion hole extending from the accommodation groove and defined through the support portion between the upper surface and the lower surface of the support portion, and the end of the at least one support stick is inserted into the first insertion hole of the at least one accommodation portion.

The support portion may further include a step difference compensation portion recessed from the upper surface of the support portion, a portion of the at least one support stick is disposed in the step difference compensation portion, and the at least one accommodation portion may include an inclination surface defining the accommodation groove and inclined from a ground bottom surface of the step difference compensation portion toward the lower surface; and a bottom surface extending from the inclination surface to a direction substantially parallel to the lower surface and defining the first insertion hole of the at least one accommodation portion.

The fixing portion may include a first welding portion, and the first welding portion is disposed on the ground bottom surface of the step difference compensation portion and does not overlap the at least one accommodation portion in the plane.

The at least one accommodation portion may further include a second welding portion that connects the at least one support stick to the at least one accommodation portion, and the second welding portion is disposed on the bottom surface and does not overlap the first insertion hole of the at least one accommodation portion in the plane.

The first insertion hole may be defined by a bottom surface and a middle surface facing the bottom surface, and a distance between the bottom surface and the middle surface is greater than a thickness of the at least one support stick and equal to or less than about five times of the thickness of the at least one support stick.

The at least one accommodation portion may include a second insertion hole defined through an upper surface of the support portion and a lower surface of the support portion, and the end of the at least one support stick is bent toward the lower surface of the support portion in the at least one accommodation portion and inserted into the second insertion hole of the at least one accommodation portion.

The second insertion hole may be substantially vertical to the upper surface of the support portion.

The fixing portion may include a third welding portion and a fourth welding portion, the third welding portion and the fourth welding portion may be disposed on the support portion, and the third welding portion and the fourth welding portion may be disposed between the at least one accommodation portion and the opening and spaced apart from each other in a direction in which the at least one support stick extends.

The at least one support stick may extend in a first direction, and the at least one accommodation portion may include a first accommodation portion accommodating a first end of both ends of the at least one support stick and a second accommodation portion accommodating a second end of the both ends of the at least one support stick.

The at least one support stick includes support sticks, and the support sticks are spaced apart from each other in a second direction intersecting the first direction.

The at least one accommodation portion accommodation portions, and the accommodation portions are spaced apart from each other in the second direction and respectively correspond to the support sticks to accommodate the support sticks, respectively.

Embodiments provide a method of manufacturing a mask frame assembly. The manufacturing method may include placing a frame body including a support portion and an opening; placing a support stick on the support portion and the opening; connecting the support stick to the support portion; and placing a mask on the frame body and the support stick. The support portion comprising an accommodation portion accommodating an end of the support stick. The connecting of the support stick may include connecting the support stick to the support portion using a fixing portion and connecting the end of the support stick to the accommodation portion.

The accommodation portion may include an accommodation groove recessed from an upper surface of the support portion toward a lower surface of the support portion and accommodating a portion of the support stick; and a first insertion hole extending from the accommodation groove and defined through the support portion between the upper surface and the lower surface of the support portion, and the end of the support stick may be inserted into the first insertion hole of the accommodation portion.

The support portion may further include a step difference compensation portion recessed from the upper surface of the support portion, a portion of the support stick may be disposed in the step difference compensation portion, and the accommodation portion may include an inclination surface defining the accommodation groove and inclined from a ground bottom surface of the step difference compensation portion toward the lower surface; and a bottom surface extending from the inclination surface to a direction substantially parallel to the lower surface and defining the first insertion hole of the accommodation portion.

The connecting of the support stick to the support portion using the fixing portion may include forming the fixing portion through a first welding process.

The connecting of the end of the support stick to the accommodation portion may include inserting the end into the first insertion hole; and connecting the support stick to the bottom surface through a second welding process.

The method may further include cutting a portion of the support stick which is outside of the support portion by the first insertion hole of the accommodation portion.

The accommodation portion may include a second insertion hole defined through the upper surface and the lower surface of the support portion, and the connecting of the end of the support stick to the accommodation portion may include inserting the end of the support stick into the second insertion hole of the accommodation portion.

The connecting of the support stick to the support portion using the fixing portion may include forming a first fixing portion that connects the support stick through a first welding process before the connecting of the end of the support stick to the accommodation portion; and forming a second fixing portion that connects the support stick through a second welding process after the connecting of the end of the support stick to the accommodation portion.

The method may further include cutting a portion of the support stick outside of the support portion by the second insertion hole of the accommodation portion.

According to the above, the support portion of the frame body is provided with the accommodation portion in which the support stick is accommodated, and the end of the support stick is accommodated in and coupled with or connected with the accommodation portion. Accordingly, the end of the support stick is prevented from being separated or detached from the frame body.

BRIEF DESCRIPTION OF THE DRAWINGS

The above and other advantages will become readily apparent by reference to the following detailed description when considered in conjunction with the accompanying drawings wherein.

DETAILED DESCRIPTION OF THE EMBODIMENTS

Figure 1:
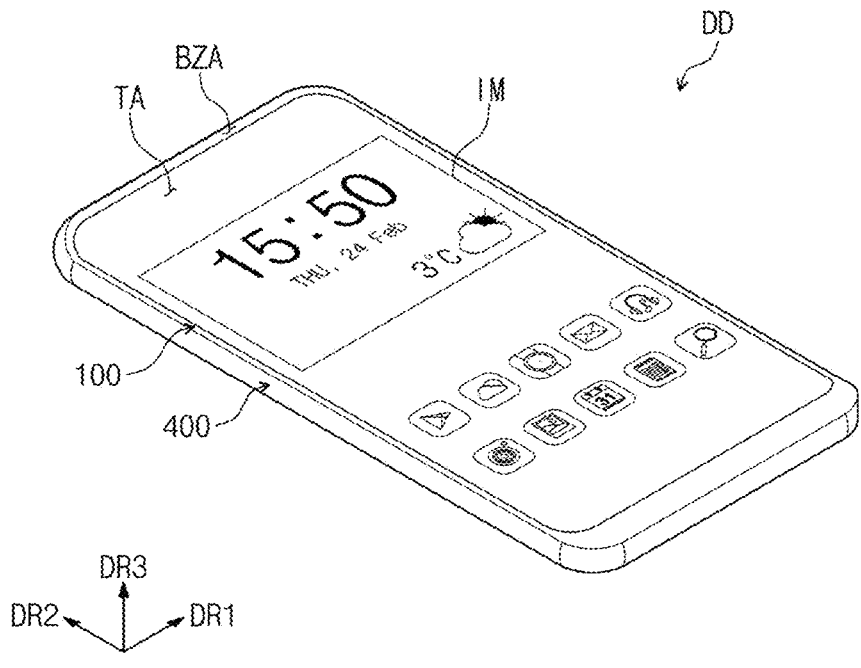
FIG. 1 is a schematic perspective view of a display device according to an embodiment.

The disclosure may be variously modified and realized in many different foul's, and thus described embodiments will be illustrated in the drawings and described in detail hereinbelow. However, the disclosure should not be limited to the disclosed forms, and should be construed to include all modifications, equivalents, or replacements included in the spirit and scope of the disclosure.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

It will be understood that the terms "connected to" or "coupled to" may include a physical or electrical connection or coupling.

Like numerals refer to like elements throughout. In the drawings, the thickness, ratio, and dimension of components are exaggerated for effective description of the technical content.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure.

As used herein, the singular forms, "a", "an" and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Spatially relative terms, such as "beneath", "below", "lower", "above", "upper" and the like, may be used herein for ease of description to describe one element or feature's relationship to another elements or features as shown in the figures.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined or implied herein.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, a mask frame assembly and a method of manufacturing the mask frame assembly according to embodiments of the disclosure will be described with reference to accompanying drawings.

Figure 2:
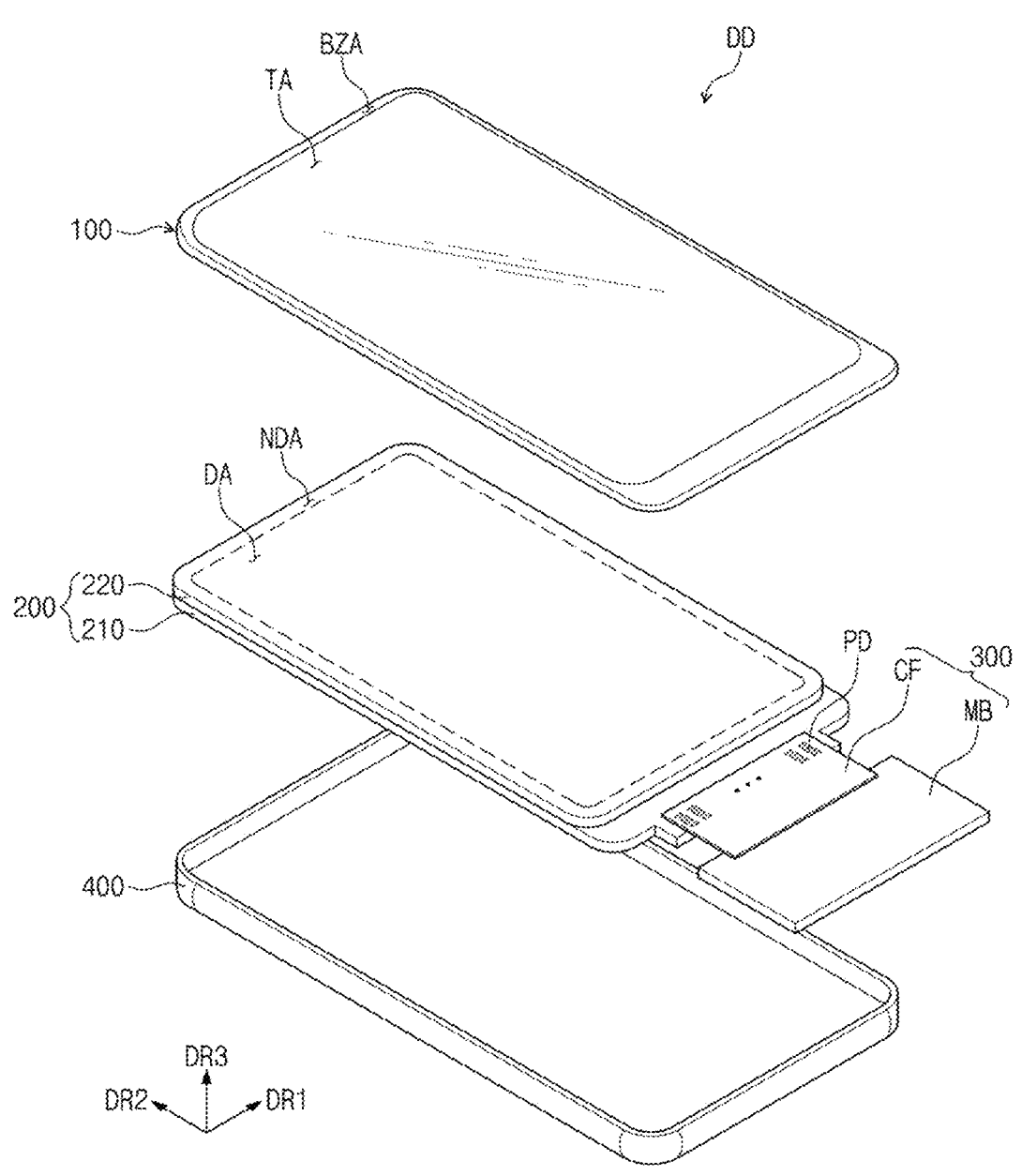
FIG. 2 is an exploded perspective view of a display device according to an embodiment.

FIG. 1 is a schematic perspective view of a display device DD according to an embodiment. FIG. 2 is an exploded perspective view of the display device DD according to an embodiment.

Referring to FIG. 1, the display device DD may be a device activated in response to an electrical signal. The display device DD may include various embodiments. For example, the display device DD may be applied to electronic devices, such as a mobile phone, a smart watch, a tablet computer, a notebook computer, a computer, a smart television, and the like, however, it should not be limited thereto or thereby. The display device DD may be applied to other electronic devices within the spirit and the scope of the disclosure. In an embodiment, the mobile phone will be described as a representative example of the display device DD.

The display device DD may display an image IM through a display surface IS, which is substantially parallel to each of a first direction DR1 and a second direction DR2, toward a third direction DR3. The display surface IS, through which the image IM is displayed, may correspond to a front surface of the display device DD. The image IM may include a still image as well as a video. In FIG. 1, a clock widget and application icons are illustrated as examples of the image IM.

In an embodiment, front (or upper) and rear (or lower) surfaces of each member of the display device DD may be defined with respect to a direction in which the image IM is displayed. The front and rear surfaces may be opposite to each other in the third direction DR3, and a normal line direction of each of the front and rear surfaces may be substantially parallel to the third direction DR3. A separation distance in the third direction DR3 between the front and rear surfaces may correspond to a thickness in the third direction DR3 of the display device DD. In the following descriptions, the expression "when viewed in a plan view" may mean a state of being viewed in the third direction DR3. Directions indicated by the first, second, and third directions DR1, DR2, and DR3 are relative to each other, and thus, the directions indicated by the first, second, and third directions DR1, DR2, and DR3 may be changed to other directions.

Referring to FIGS. 1 and 2, the display device DD may include a window 100, a display module 200, a driving circuit 300, and a housing 400. In an embodiment, the window 100 and the housing 400 may be coupled or connected to each other to provide an exterior of the display device DD.

The window 100 may include an optically transparent material. For example, the window 100 may include a glass, sapphire, or plastic material. The window 100 may have a single-layer or multi-layer structure. As an example, the window 100 may include plastic films coupled or connected to each other or a glass substrate and a plastic film coupled or connected to the glass substrate.

The window 100 may include a transmissive area TA and a bezel area BZA. The front surface of the display device DD may correspond to the transmissive area TA and the bezel area BZA of the window 100.

The transmissive area TA may be an optically transparent area. The user may view the image IM through the transmissive area TA. In an embodiment, the transmissive area TA may have a quadrangular shape with rounded vertices, however, this is an example. The transmissive area TA may have a variety of shapes and should not be particularly limited.

The bezel area BZA may be an area having a relatively lower transmittance as compared with the transmissive area TA. For example, the bezel area BZA may be an area on which a material having a color is printed.

The bezel area BZA may be adjacent to the transmissive area TA. The bezel area BZA may surround the transmissive area TA. Accordingly, the transmissive area TA may have a shape defined by the bezel area BZA, however, this is by way of an example, and the bezel area BZA may be disposed adjacent to only one side or a side of the transmissive area TA or may be omitted.

The display module 200 may be disposed under or below the window 100. The display module 200 may include a display panel 210 and an input sensing unit 220. The display module 200 may display the image IM and may sense an external input. The display module 200 may include a display area DA and a non-display area NDA.

The image IM may be displayed through the display area DA and may not be displayed through the non-display area NDA. The non-display area NDA may surround the display area DA. However, the disclosure should not be limited thereto or thereby, and the shapes of the display area DA and the non-display area NDA may be changed.

The transmissive area TA may overlap at least a portion of the display area DA. Accordingly, the user may view the image IM or may provide the external input through the transmissive area TA, however, this is an example. For example, an area through which the image IM is displayed and an area through which the external input is sensed may be separated from each other in the display area DA, and they should not be particularly limited.

The non-display area NDA may be covered by the bezel area BZA. The non-display area NDA may be blocked by the bezel area BZA, and thus, the non-display area NDA may not be viewed from the outside. In an embodiment, the display area DA and the non-display area NDA are shown as being flat, however, this is an example, and a portion of the non-display area NDA and a portion of the display area DA may be bent. The portion of the non-display area NDA may be bent toward a rear surface of the display device DD, and thus, a size of the bezel area BZA may be reduced in the front surface of the display device DD.

The display panel 210 may be a light-emitting type display panel, however, it should not be particularly limited. For instance, the light-emitting type display panel may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot and a quantum rod.

The display panel 210 may be flexible. The term "flexible" used herein in respect of a member may mean that the member has a bendable property, which may include a structure that is completely folded, a structure that is partially curved, and all the structures in between. For example, the display panel 210 may be a curved display panel or a foldable display panel. By way of example, the display panel 210 may be rigid.

The input sensing unit 220 may be disposed on the display panel 210. As shown in FIG. 2, the input sensing unit 220 may be disposed on (for example, directly disposed on) the display panel 210. For example, the input sensing unit 220 may be formed on the display panel 210 through successive processes, and an adhesive film may not be disposed between the input sensing unit 220 and the display panel 210. However, according to an embodiment, an adhesive film may be disposed between the input sensing unit 220 and the display panel 210. The input sensing unit 220 may be fixed to an upper surface of the display panel 210 by an adhesive film after being manufactured through a separate process from the display panel 210.

The input sensing unit 220 may sense an external input applied thereto from the outside. The external input may include various forms of inputs provided from the outside of the display device DD. For example, the external inputs may include a proximity input (for example, hovering) applied in case that approaching close to or adjacent to the display device DD at a distance as well as a touch input by a user's body part (for example, a user's hand). The external inputs may be provided in the form of force, pressure, temperature, light, etc., within the spirit and the scope of the disclosure.

The driving circuit 300 may be electrically connected to the display module 200. The driving circuit 300 may include a main circuit board MB and a flexible film CF.

The flexible film CF may be electrically connected to the display module 200. The flexible film CF may be connected to pads PD of the display module 200, which are disposed in the non-display area NDA. The flexible film CF may provide electrical signals to the display module 200 to drive the display module 200. The electrical signals may be generated by the flexible film CF or the main circuit board MB.

The main circuit board MB may include various driving circuits to drive the display module 200 or a connector to provide a power. The main circuit board MB may be a rigid printed circuit or a flexible printed circuit.

One flexible film CF connecting the display module 200 and the main circuit board MB is shown in an embodiment, however, the number of the flexible films should not be limited to one. For example, the flexible film CF may be provided in plural, and the flexible films CF may connect the display panel 210 and the main circuit board MB.

The housing 400 may be coupled or connected to the window 100. The housing 400 may be coupled or connected to the window 100 to provide an inner space therein. The display module 200 may be accommodated in the inner space.

The housing 400 may include a material with a relatively high rigidity. For example, the housing 400 may include a glass, plastic, or metal material or frames and/or plates of combinations thereof. The housing 400 may stably protect the components of the display device DD accommodated in the inner space from external impacts.

Figure 3:
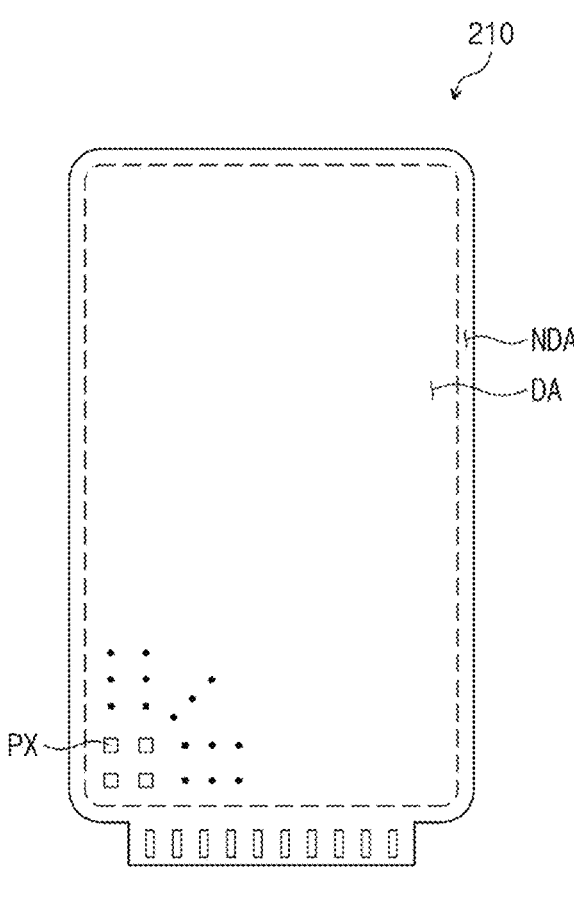
FIG. 3 is a schematic plan view of a display panel according to an embodiment.

FIG. 3 is a schematic plan view of the display panel 210 according to an embodiment.

Referring to FIG. 3, the display area DA may include pixels PX. Each of the pixels PX may include a display element and a thin film transistor electrically connected to the display element. The display element may include, for example, an organic light emitting diode. The pixels PX may be arranged or disposed in the display area DA and may provide lights. The pixels PX may be arranged or disposed in the display area DA, however, they should not be limited thereto or thereby. Some or a number of the pixels PX may be arranged or disposed in the non-display area NDA.

The pixels PX may be arranged or disposed along the first direction DR1 and the second direction DR2 perpendicular to the first direction DR1 in a matrix form. According to an embodiment, the pixels PX may include first, second, and third light emitting pixels respectively displaying a red color, a green color, and a blue color.

Figure 4:
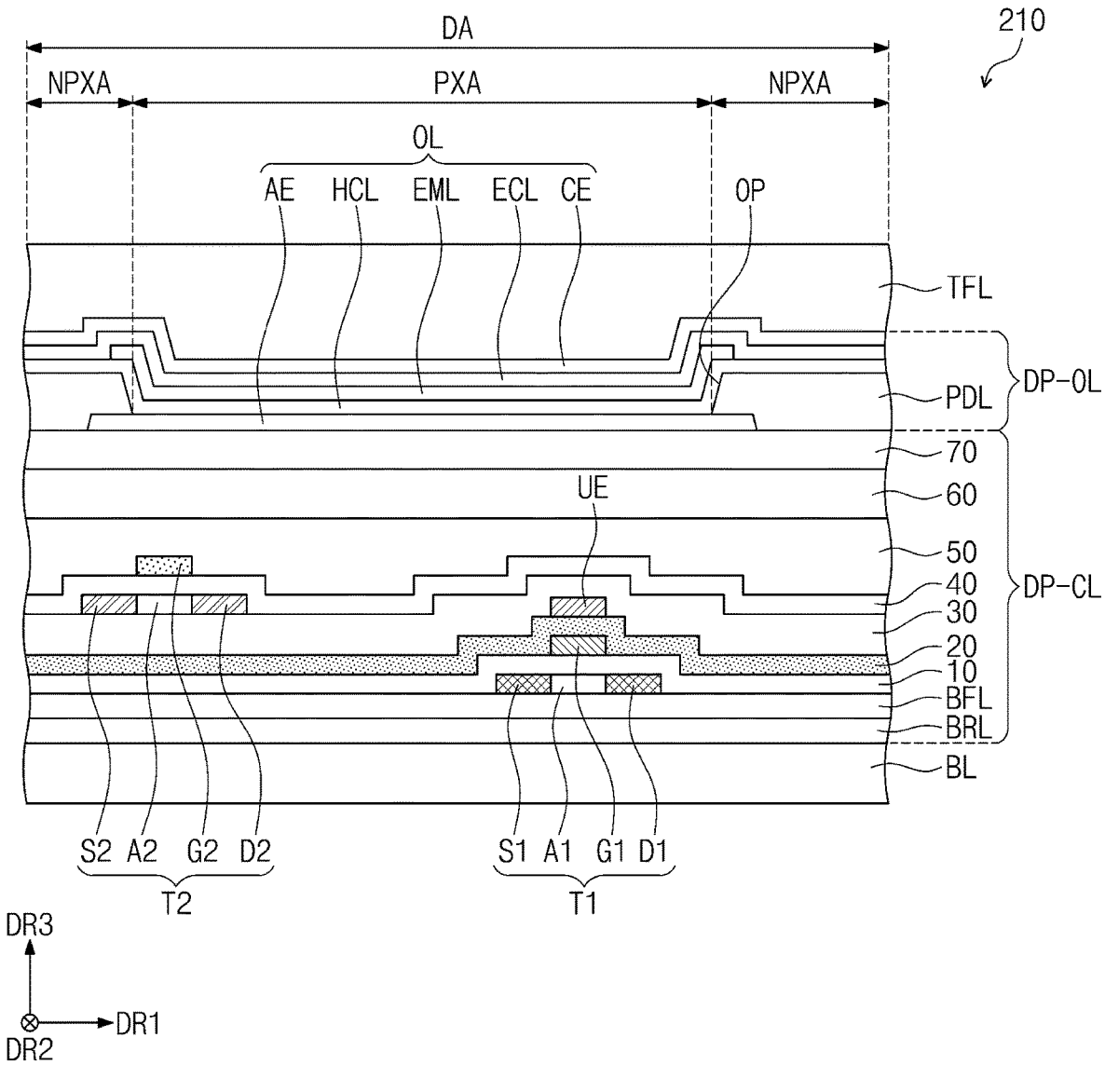
FIG. 4 is a schematic cross-sectional view of a display panel according to an embodiment.

FIG. 4 is a schematic cross-sectional view of the display panel 210 according to an embodiment.

As shown in FIG. 4, the display area DA may include a light emitting area PXA and a non-light-emitting area NPXA. The light emitting area PXA may correspond to the first, second, and third light emitting pixels.

Referring to FIG. 4, the display panel 210 may include a base layer BL, a circuit element layer DP-CL, a display element layer DP-OL, and an encapsulation layer TFL.

The base layer BL may be a display substrate on which the circuit element layer DP-CL and the display element layer DP-OL are disposed. The base layer BL may have a stack structure including at least one of a silicon substrate, a plastic substrate, a glass substrate, a polymer layer, or insulating layers.

The circuit element layer DP-CL may be disposed on the base layer BL. The circuit element layer DP-CL may include at least one insulating layer and a circuit element. The circuit element may include a signal line and a switching element, for example, a transistor, included in each of the pixels PX (refer to FIG. 3). The circuit element layer DP-CL may be formed by forming an insulating layer, a semiconductor layer, and a conductive layer through a coating or deposition process and by patterning the insulating layer, the semiconductor layer, and the conductive layer through several photolithography processes.

According to an embodiment, the circuit element layer DP-CL may include a barrier layer BRL, a buffer layer BFL, first, second, third, fourth, fifth, sixth, and seventh insulating layers 10, 20, 30, 40, 50, 60, and 70, and thin film transistors T1 and T2. The buffer layer BFL, the barrier layer BRL, and the first to seventh insulating layers 10 to may include one of an inorganic layer and an organic layer.

The barrier layer BRL may be disposed on the base layer BL. The barrier layer BRL may prevent impurities present in the base layer BL or moisture from the outside from being diffused to the thin film transistors T1 and T2. The impurities may be gases or sodium generated by pyrolysis of the base layer BL.

The buffer layer BFL may be disposed on the barrier layer BRL. A semiconductor pattern may be disposed on the buffer layer BFL. The buffer layer BFL may increase an adhesion between the base layer BL and the semiconductor pattern.

The thin film transistors T1 and T2 included in the circuit element layer DP-CL may include a first pixel transistor T1 and a second pixel transistor T2. The first pixel transistor T1 and the second pixel transistor T2 may be disposed in the display area DA. The first pixel transistor T1 and the second pixel transistor T2 may form the pixel PX (refer to FIG. 3) together with a light emitting element OL disposed on the transistors.

FIG. 4 shows an arrangement relation between a first active A1, a second active A2, a first gate G1, a second gate G2, a first source S1, a second source S2, a first drain D1, and a second drain D2 that form the first and second pixel transistors T1 and T2.

In an embodiment, the first active A1 and the second active A2 may include different materials from each other. As an example, the first active A1 may include a polysilicon semiconductor, and the second active A2 may include a metal oxide semiconductor. However, according to an embodiment, the first active A1 and the second active A2 may include a same material or a similar material as each other, and the stack structure of the circuit element layer DP-CL may be relatively simple.

The first source S1 and the first drain D1 may have a doping concentration higher than that of the first active A1 and may have a function of an electrode. The second source S2 and the second drain D2 may be areas where the metal oxide semiconductor is reduced and may have a function of an electrode.

The circuit element layer DP-CL may further include an upper electrode UE. The upper electrode UE may be disposed to overlap the first gate G1. The upper electrode UE may serve as a gate electrode of the first pixel transistor T1 together with the first gate G1 or may form a capacitor together with the first gate G1, however, this is an example. According to an embodiment, the upper electrode UE may be omitted from the display panel 210.

The display element layer DP-OL may be disposed on the circuit element layer DP-CL. The display element layer DP-OL may include the light emitting element OL and a pixel definition layer PDL. The light emitting element OL may be an organic light emitting diode or a quantum dot light emitting diode. The light emitting element OL may include a first electrode AE, a hole control layer HCL, a light emitting layer EML, an electron control layer ECL, and a second electrode CE, which may be sequentially stacked each other.

The first electrode AE may be disposed on the seventh insulating layer 70. At least a portion of the first electrode AE may be exposed through an opening OP of the pixel definition layer PDL.

The hole control layer HCL and the electron control layer ECL may be commonly disposed in the light emitting area PXA and the non-light-emitting area NPXA. The hole control layer HCL and the electron control layer ECL may be commonly formed in the pixels using an open mask.

The light emitting layer EML may be provided in a pattern to correspond to the opening OP. The light emitting layer EML may be formed differently according to the light emitting pixels. The light emitting layer EML may be deposited in a different way from the hole control layer HCL and the electron control layer ECL having a film shape. A mask frame assembly MSA (refer to FIG. 6A) according to the disclosure may be used to form the light emitting layer EML having a pattern.

The light emitting layer EML may be provided in a pattern to correspond to the opening OP of the pixel definition layer PDL. The light emitting layer EML may be deposited and formed using the mask frame assembly MSA described later.

The second electrode CE may be disposed on the electron control layer ECL. The second electrode CE may be commonly disposed in the light emitting area PXA and the non-light-emitting area NPXA.

The encapsulation layer TFL may be disposed on the display element layer DP-OL. The encapsulation layer TFL may include thin layers sequentially stacked each other. The thin layers may include an inorganic layer and an organic layer. At least one thin layer of the thin layers may be disposed to improve an optical efficiency, and another thin layer of the thin layers may be disposed to protect the light emitting element from oxygen or moisture.

Figure 5:
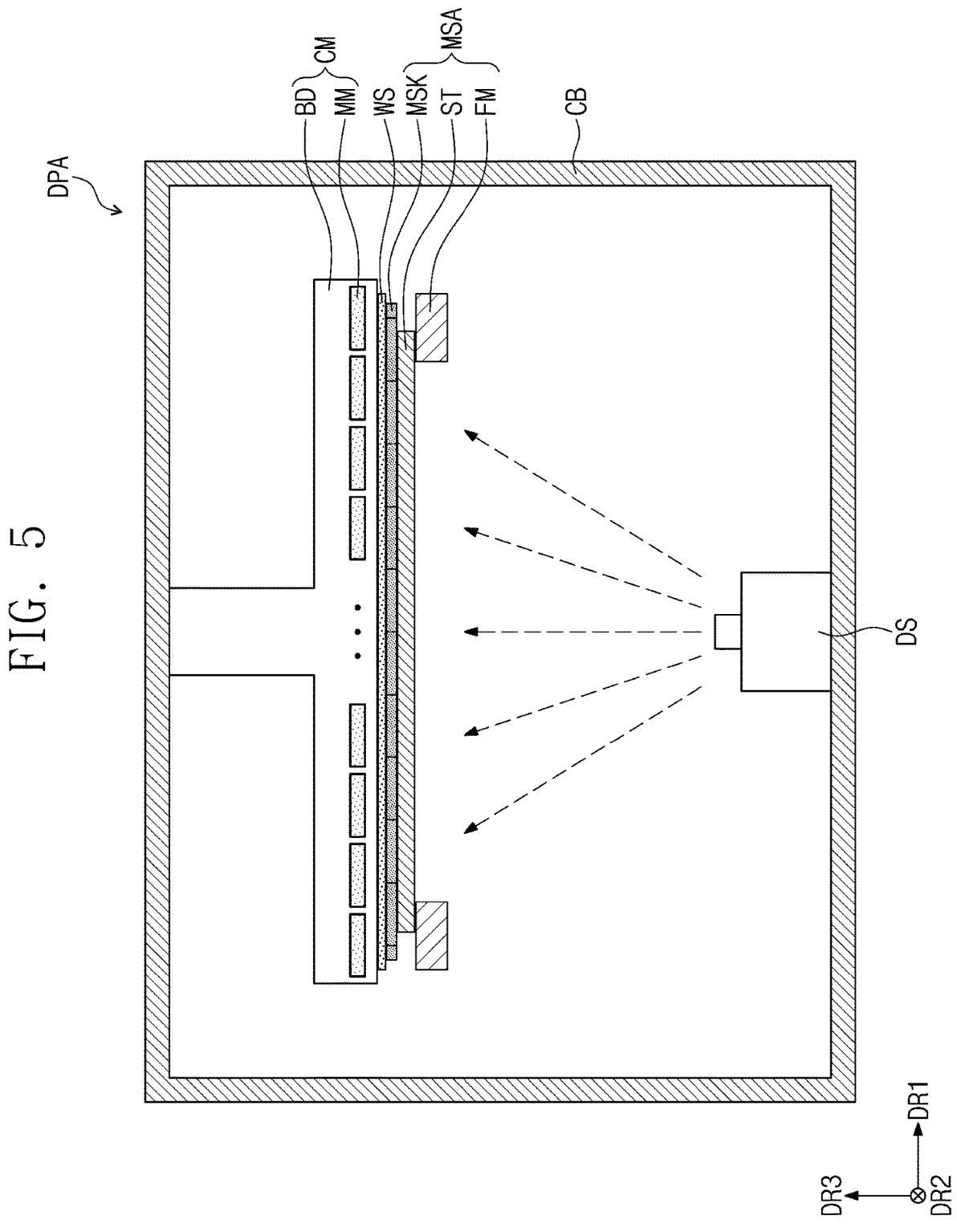
FIG. 5 is a schematic cross-sectional view of a deposition apparatus according to an embodiment.

FIG. 5 is a schematic cross-sectional view of a deposition apparatus DPA according to an embodiment. The deposition apparatus DPA may be used for a deposition process of the display panel 210 of FIG. 4, for example, a deposition process of the light emitting layer EML.

Referring to FIG. 5, the deposition apparatus DPA may include a deposition chamber CB, a fixing member CM, a deposition source DS, and the mask frame assembly MSA. Although not shown in figures, the deposition apparatus DPA may further include an additional mechanical device to implement an inline system.

A deposition condition of the deposition chamber CB may be set at a vacuum state. The deposition chamber CB may include a bottom surface, a ceiling surface, and sidewalls. The bottom surface of the deposition chamber CB may be substantially parallel to a plane defined by the first direction DR1 and the second direction DR2. A normal line direction of the bottom surface of the deposition chamber CB may be substantially parallel to the third direction DR3. In the following descriptions, an expression "on the plane" is set based on a plane parallel to the plane defined by the first direction DR1 and the second direction DR2.

The fixing member CM may be disposed in the deposition chamber CB, may be disposed over the deposition source DS, and may fix the mask frame assembly MSA. The fixing member CM may be installed at the ceiling surface of the deposition chamber CB. The fixing member CM may include a jig or robot arm to hold the mask frame assembly MSA.

The fixing member CM may include a body BD and magnetic members MM coupled or connected to the body BD. The body BD may include a plate to fix the mask frame assembly MSA, and an embodiment should not be particularly limited as long as the mask frame assembly MSA is fixed. The magnetic members MM may be disposed inside or outside of the body BD. The magnetic members MM may fix the mask frame assembly MSA using a magnetic force.

A work substrate WS loaded in the deposition chamber CB may be disposed between the fixing member CM and the mask frame assembly MSA. The work substrate WS may include a glass substrate or a plastic substrate. The work substrate WS may include a polymer layer disposed on a base substrate. The base substrate may be removed at a later process in a manufacturing process of the display panel 210 (refer to FIG. 4), and the polymer layer may correspond to the base layer BL of FIG. 4.

The deposition source DS may evaporate a deposition material, for example, a light emitting material, and the deposition material may be ejected as a deposition vapor. The deposition vapor may be deposited on the work substrate WS through the mask frame assembly MSA in a pattern.

The mask frame assembly MSA may be disposed in the deposition chamber CB, may be disposed above the deposition source DS, and may support the work substrate WS. The mask frame assembly MSA may include a frame body FM, support sticks ST, and masks MSK. In an embodiment, the mask frame assembly MSA may include one type of the support sticks ST extending in a same direction, however, it should not be limited thereto or thereby. According to an embodiment, the mask frame assembly MSA may further include another type of support sticks extending in another direction.

Figure 6A:
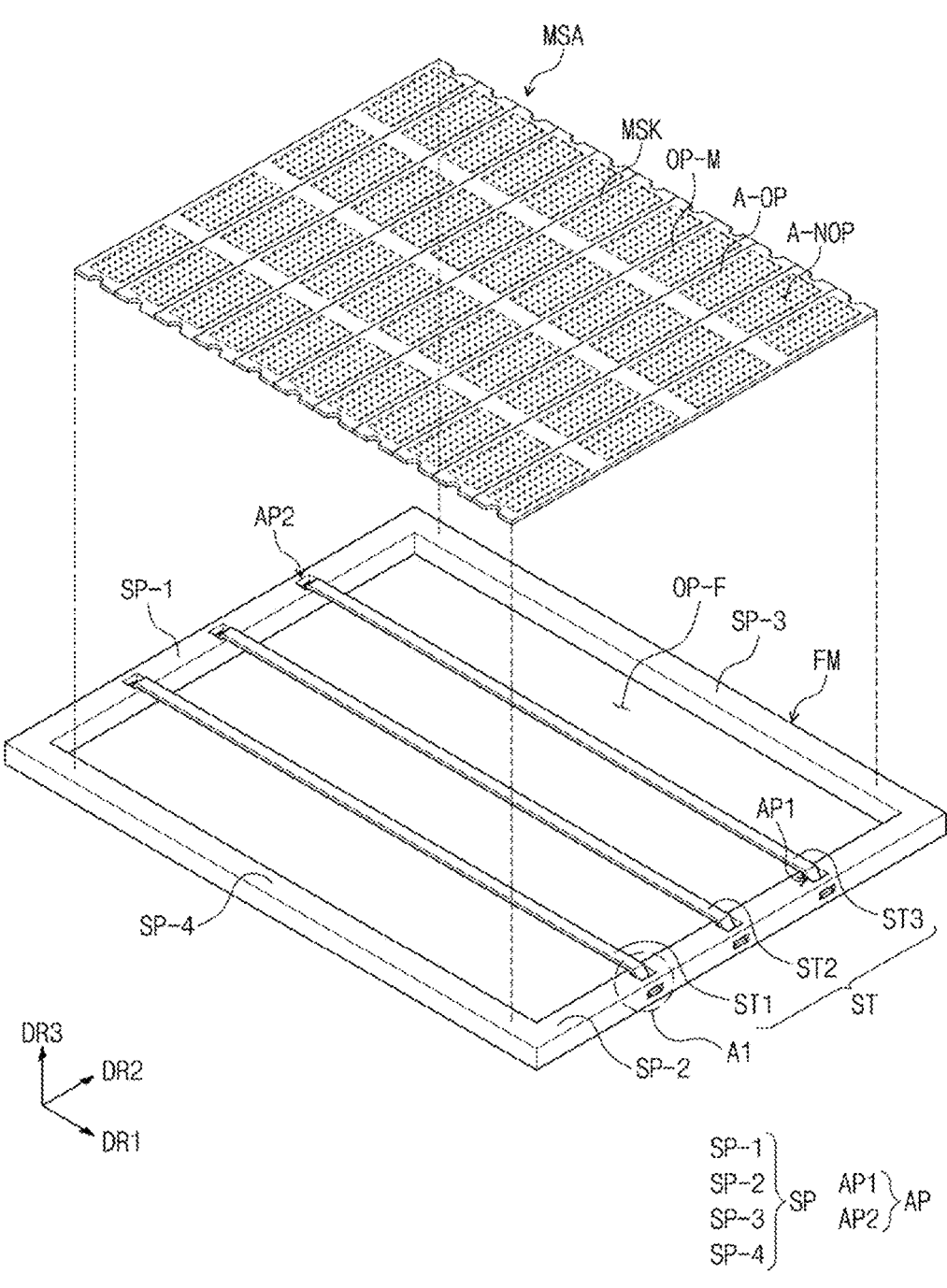
FIG. 6A is a schematic perspective view of a mask frame assembly according to an embodiment.
Figure 6B:
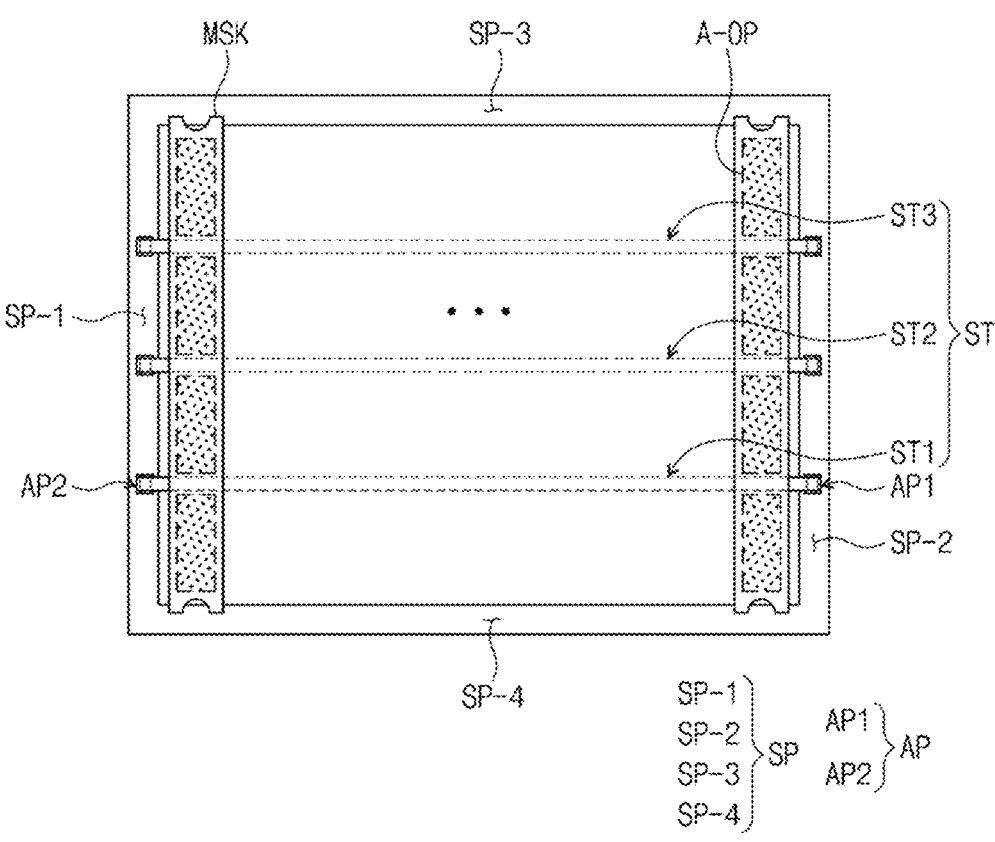
FIG. 6B is a schematic plan view of a mask frame assembly according to an embodiment.

FIG. 6A is a schematic perspective view of the mask frame assembly MSA according to an embodiment. FIG. 6B is a schematic plan view of the mask frame assembly MSA according to an embodiment. The mask frame assembly MSA may include the frame body FM, the support sticks ST, and the masks MSK.

The frame body FM may include a support portion SP provided with an opening OP-F formed therethrough. The support portion SP may have a quadrangular frame shape when viewed in a plan view. The support portion SP may include a metal material. As an example, the metal material may include nickel (Ni), nickel-cobalt alloy, or nickel-iron alloy. The support portion SP may include four portions. The support portion SP may include a first extension portion SP-1 and a second extension portion SP-2 facing the first extension portion SP-1 in the first direction DR1. The support portion SP may include a third extension portion SP-3 and a fourth extension portion SP-4 facing the third extension portion SP-3 in the second direction DR2, and each of the third extension portion SP-3 and a fourth extension portion SP-4 may connect the first extension portion SP-1 and the second extension portion SP-2. The first extension portion SP-1 to the fourth extension portion SP-4 may be coupled or connected with each other by a welding process or may be integral with each other.

The opening OP-F may be defined inside the frame body FM. The masks MSK may be exposed through the opening OP-F, and the opening OP-F may have a shape that varies depending on the shape of the support portion SP. As an example, the opening OP-F may have a quadrangular shape when viewed in a plan view.

Referring to FIGS. 6A and 6B, the support sticks ST may include first, second, and third support sticks ST1, ST2, and ST3. The first, second, and third support sticks ST1, ST2, and ST3 may be coupled or connected with the support portion SP to overlap the opening OP-F. The first, second, and third support sticks ST1, ST2, and ST3 may be coupled or connected with an accommodation portion AP defined in each of the first extension portion SP-1 and the second extension portion SP-2. FIG. 6A shows a structure in which three support sticks ST are provided as a representative example, however, the disclosure should not be limited thereto or thereby. According to an embodiment, four or more support sticks ST may be employed. The first, second, and third support sticks ST1, ST2, and ST3 may extend in the first direction DR1 and may be arranged or disposed spaced apart from each other in the second direction DR2 intersecting the first direction DR1.

The accommodation portion AP may include a first accommodation portion AP1 in which a first end of both ends of the support sticks ST is accommodated and a second accommodation portion AP2 in which a second end of both ends of the support sticks ST is accommodated. As an example, the first accommodation portion AP1 may be defined in the second extension portion SP-2, and the second accommodation portion AP2 may be defined in the first extension portion SP-1. By way of example, the accommodation portion AP may include only one of the first accommodation portion AP1 and the second accommodation portion AP2. FIG. 6A shows a structure in which the accommodation portion AP may include three first accommodation portions AP1 and three second accommodation portions AP2 as a representative example, however, the disclosure should not be limited thereto or thereby. According to an embodiment, the number of each of the first and second accommodation portions AP1 and AP2 may correspond to the number of the support sticks ST. In case that the accommodation portion AP is provided in plural, the accommodation portions AP may be arranged or disposed spaced apart from each other in the second direction DR2, may be placed to respectively correspond to the support sticks ST, and may accommodate the support sticks ST.

The masks MSK may be disposed on the frame body FM and the support sticks ST. The masks MSK may extend in the second direction DR2 and may be arranged or disposed in the first direction DR1. The masks MSK may overlap the opening OP-F, however, the disclosure should not be limited thereto or thereby. According to an embodiment, the masks MSK may have a size greater than a size of the opening OP-F. The masks MSK may include Invar with a thermal expansion coefficient smaller than that of the support portion SP of the frame body FM. The masks MSK may include, for example, nickel (Ni), nickel-cobalt alloy, or nickel-iron alloy.

Each of the masks MSK may be provided with openings OP-M (hereinafter, referred to as mask openings) defined therethrough. Each of the masks MSK may include an effective area A-OP through which the mask openings OP-M are defined and a non-effective area A-NOP adjacent to the effective area A-OP. In an embodiment, each of the masks MSK may include effective areas A-OP arranged or disposed in the second direction DR2. The mask openings OP-M may be arranged or disposed in each of the effective areas A-OP according to a rule (for example, a matrix form). The light emitting layer EML (refer to FIG. 4) may have a shape corresponding to a shape of the mask openings OP-M when viewed in the plan view.

The masks MSK may be coupled or connected with the support portion SP. As an example, the masks MSK may be coupled or connected with the support portion SP by a welding process. In the manufacturing process of the mask frame assembly MSA, the masks MSK may be welded to the support portion SP after being tensioned in second direction DR2. As shown in FIGS. 6A and 6B, the mask frame assembly MSA may include the plural masks MSK separated from each other, however, the disclosure should not be limited thereto or thereby. One large mask with a size corresponding to the opening OP-F may be coupled or connected with the frame body FM. However, in case that the masks are provided in plural, the sagging phenomenon is less likely to occur as compared with the large mask.

Figure 7:
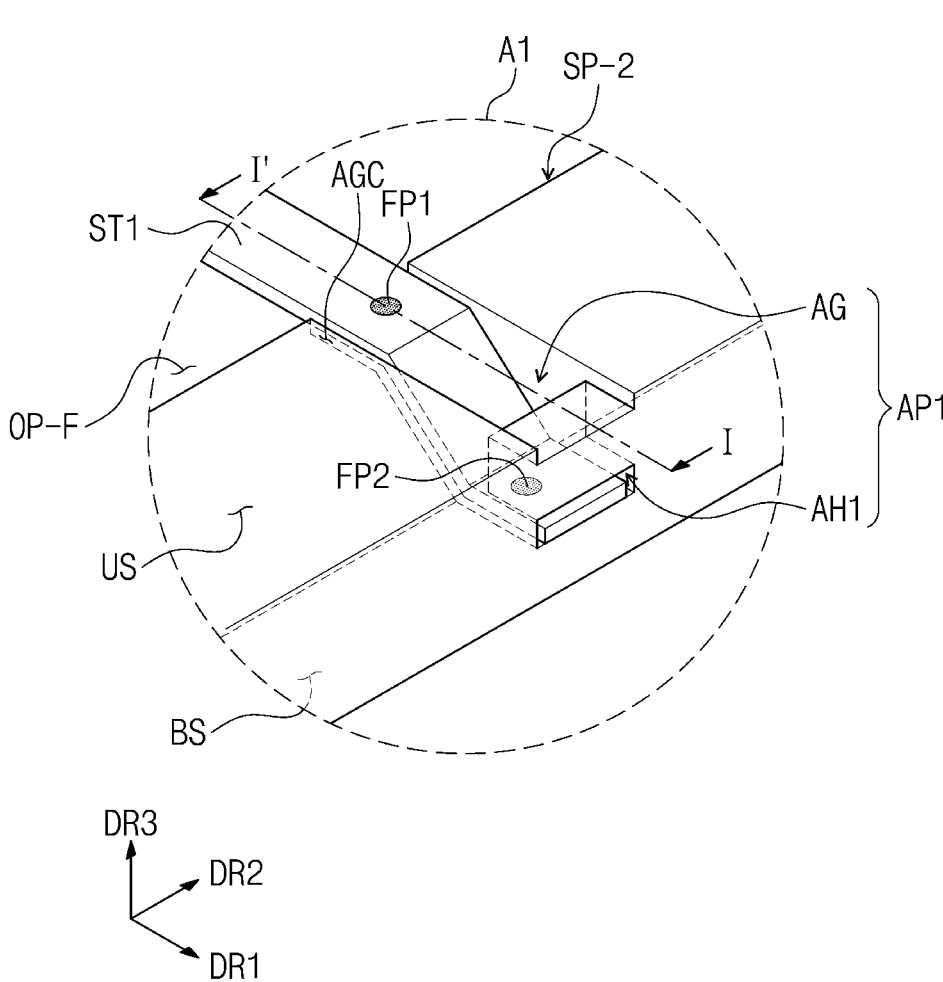
FIG. 7 is an enlarged view of an area A1 shown in FIG. 6A.
Figure 8A:
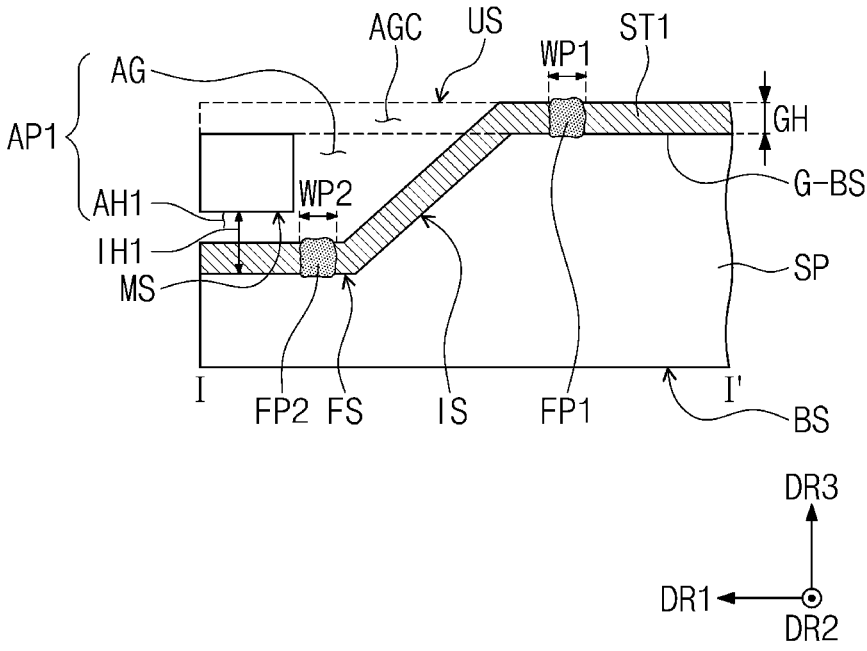
FIG. 8A is a schematic cross-sectional view of the mask frame assembly taken along line I-I' of FIG. 7 according to an embodiment.

FIG. 7 is an enlarged view of an area A1 shown in FIG. 6A. FIG. 8A is a schematic cross-sectional view of the mask frame assembly taken along line I-I' of FIG. 7 according to an embodiment.

Referring to FIGS. 6A, 7, and 8A, an end, for example, the first end, of the first support stick ST1 may be accommodated in the accommodation portion AP, for example, the first accommodation portion AP1. The first accommodation portion AP1 may include an accommodation groove AG formed by recessing the support portion SP, for example, the second extension portion SP-2, from an upper surface US of the support portion SP toward a lower surface BS of the support portion SP and a first insertion hole AH1 allowing the end of the first support stick ST1 to be inserted into the support portion SP. However, the shape of the first accommodation portion AP1 should not be limited to the shape shown in FIG. 7, and other embodiments will be described later.

The support portion SP may further include a step difference compensation portion AGC recessed from the upper surface US of the support portion SP. A portion of the first support stick ST1 may be placed in the step difference compensation portion AGC. A width in the second direction DR2 of the step difference compensation portion AGC may be substantially the same as a width in the second direction DR2 of the first support stick ST1, however, the disclosure should not be limited thereto or thereby. According to an embodiment, the step difference compensation portion AGC may have a width in the second direction DR2 greater than the width in the second direction DR2 of the first support stick ST1 such that the first support stick ST1 may be readily seated. A distance from the upper surface US of the support portion SP to a ground bottom surface G-BS of the step difference compensation portion AGC may be defined as a depth GH of the step difference compensation portion AGC. The depth GH of the step difference compensation portion AGC may be equal to or greater than a thickness of the first support stick ST1. The depth GH of the step difference compensation portion AGC may be uniform in the first direction DR1. As the first support stick ST1 is accommodated in the step difference compensation portion AGC, the mask MSK disposed on the first support stick ST1 may be coupled or connected with the upper surface US of the support portion SP without causing the step difference through the welding process.

The first support stick ST1 may be accommodated in the accommodation groove AG. The accommodation groove AG may have a quadrangular shape when viewed in the plane. A width in the second direction DR2 of the accommodation groove AG may be substantially the same as the width in the second direction DR2 of the first support stick ST1, however, it should not be limited thereto or thereby. According to an embodiment, the width in the second direction DR2 of the accommodation groove AG may be greater than the width in the second direction DR2 of the first support stick ST1 such that the first support stick ST1 may be readily accommodated.

The first insertion hole AH1 may extend from the accommodation groove AG and may be formed through the support portion SP between the upper surface US and the lower surface BS of the support portion SP to secure a space in which the first support stick ST1 is accommodated. The first insertion hole AH1 may be formed through the support portion SP along a direction substantially parallel to the first direction DR1. The first insertion hole AH1 may extend to an outer side surface of the support portion SP. When looking at the outer side surface in a direction opposite to the first direction DR1, the first insertion hole AH1 may have a quadrangular shape.

The support portion SP may contact (for example, directly contact) the first support stick ST1. The mask frame assembly MSA may further include a first fixing portion FP1 to fix the first support stick ST1 to the support portion SP. The first fixing portion FP1 may be disposed between the accommodation portion AP and the opening OP-F and may fix the first support stick ST1 disposed on the support portion SP, for example, the step difference compensation portion AGC, to a certain position. The first fixing portion FP1 may include a separate fixing device to fix the first support stick ST1 to the support portion SP. In detail, the fixing device may include a magnet, a vacuum hole, and/or an electrostatic chuck (ESC). In the case where the fixing device is the magnet, the fixing device may be magnetically coupled or connected with the first support stick ST1 to fix the first support stick ST1 to the support portion SP. In the case where the fixing device is the vacuum hole, the fixing device may fix the first support stick ST1 placed on the vacuum hole to the support portion SP with a vacuum pressure. In the case where the fixing device is the electrostatic chuck, the fixing device may fix the first support stick ST1 to the support portion SP with an electrostatic force. The first fixing portion FP1 may have a shape extending in one of the first and second directions DR1 and DR2. The first fixing portion FP1 may be provided in plural, and the first fixing portions FP1 may be arranged or disposed in one of the first and second directions DR1 and DR2.

According to an embodiment, the first fixing portion FP1 disposed on the support portion SP may include a first welding portion WP1. The first welding portion WP1 may fix the first support stick ST1 to the ground bottom surface G-BS of the step difference compensation portion AGC, and thus, the end of the first support stick ST1 may be readily accommodate in the first insertion hole AH1. The first welding portion WP1 may be disposed between the accommodation portion AP and the opening OP-F, and thus, the accommodation portion AP may not overlap the first welding portion WP1.

The accommodation portion AP may include an inclination surface IS inclined from the upper surface US of the support portion SP, for example, the ground bottom surface G-BS of the step difference compensation portion AGC, to the lower surface BS of the support portion SP and a bottom surface FS extending from the inclination surface IS to a direction substantially parallel to the lower surface BS of the support portion SP.

The inclination surface IS may extend from the ground bottom surface G-BS of the step difference compensation portion AGC and may be spaced apart from the first insertion hole AH1 in the first direction DR1. According to an embodiment, the inclination surface IS and the lower surface BS of the support portion SP may form an inclination angle equal to or greater than about 25° and equal to or smaller than about 90°. The inclination angle may vary depending on a length in the first direction DR1 of the first support stick ST1. The first support stick ST1 may be disposed on the inclination surface IS, and the first support stick ST1 may be adhered to the inclination surface IS.

The bottom surface FS may be substantially parallel to the upper surface US and the lower surface BS of the support portion SP. The mask frame assembly MSA may further include a second fixing portion FP2 to fix the first support stick ST1 to the accommodation portion AP. As an example, the second fixing portion FP2 may include a second welding portion WP2. The second welding portion WP2 may be disposed on the bottom surface FS and may not overlap the first insertion hole AH1 and the inclination surface IS when viewed in the plane. The first support stick ST1 may be stably fixed to the accommodation portion AP by the second welding portion WP2. Accordingly, the first support stick ST1 may be fixed to the accommodation portion AP while the end of the first support stick ST1 is inserted into the first insertion hole AH1. In the case where the mask frame assembly MSA is used several times in the deposition process while the end of the first support stick ST1 is fixed to the accommodation portion AP, the end of the first support stick ST1 may be prevented from being separated from the support portion SP as compared with a case where the end of the first support stick ST1 is fixed to the ground bottom surface G-BS of the step difference compensation portion AGC.

The first insertion hole AH1 may be defined by the bottom surface FS and a middle surface MS facing the bottom surface FS in the first insertion hole AH1. The middle surface MS may be disposed between the bottom surface FS and the upper surface US of the support portion SP and may be substantially parallel to the bottom surface FS. A distance between the bottom surface FS and the middle surface MS may be defined as a height IH1 of the first insertion hole AH1. The height IH1 of the first insertion hole AH1 may be greater than the thickness of the first support stick ST1 and equal to or smaller than five times of the thickness of the first support stick ST1 to allow the first support stick ST1 to be readily accommodated. FIG. 8A shows the structure in which the end of the first support stick ST1 is disposed in the first insertion hole AH1, however, the discloser should not be limited thereto or thereby. As an example, the end of the first support stick ST1 may include a portion withdrawn to the outside through the first insertion hole AH1.

Figure 8B:
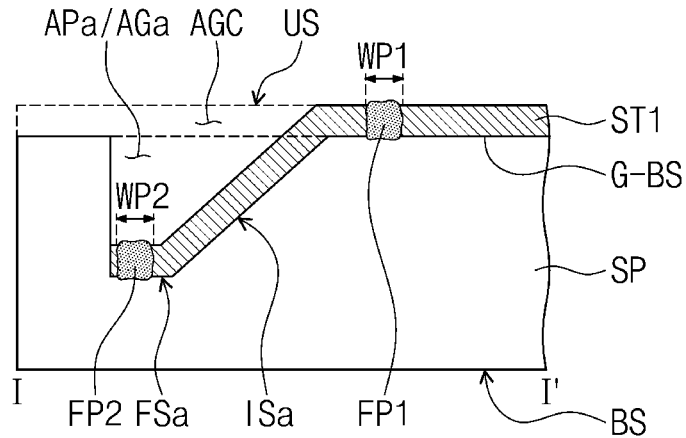
FIGS. 8B and 8C are schematic cross-sectional views of mask frame assemblies according to embodiments.
Figure 8C:
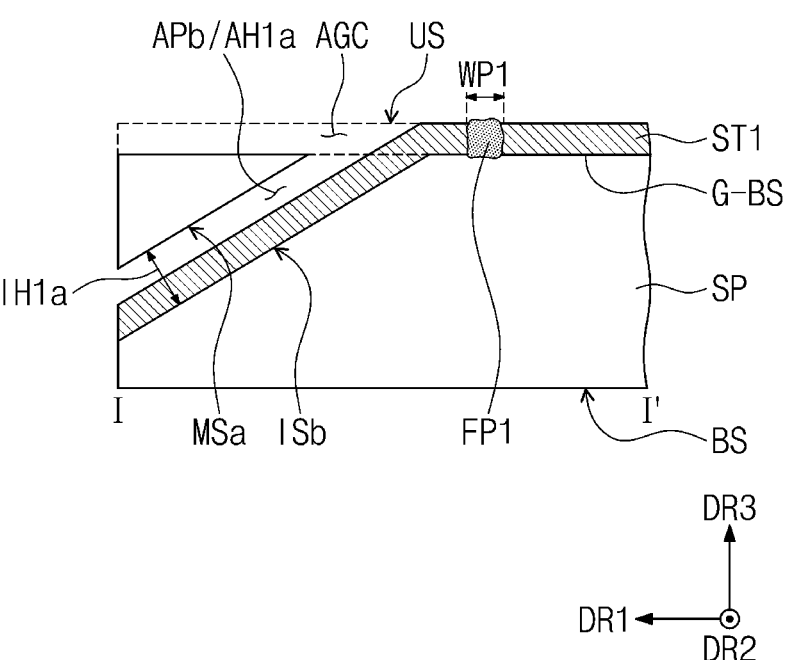

FIGS. 8B and 8C are schematic cross-sectional views of mask frame assemblies according to embodiments. As compared with FIG. 8A, FIG. 8B shows a structure in which the first insertion hole AH1 is omitted.

Referring to FIGS. 6A and 8B, an accommodation portion APa may include an accommodation groove AGa. The accommodation groove AGa may be recessed from an upper surface US toward a lower surface BS of a support portion SP. As an example, the accommodation groove AGa may be defined by an inclination surface ISa and a bottom surface FSa. The bottom surface FSa may have a length smaller than that of the bottom surface FS shown in FIG. 8A. A length in the first direction DR1 of a first support stick ST1 may also be smaller than that of the first support stick ST1 of FIG. 8A.

According to an embodiment, a first fixing portion FP1 may include a first welding portion WP1 that fixes the first support stick ST1 to a ground bottom surface G-BS of a step difference compensation portion AGC. A second fixing portion FP2 may include a second welding portion WP2 that stably fixes an end of the first support stick ST1 to the accommodation portion APa. The second welding portion WP2 may be disposed on the bottom surface FSa. In a case where the mask frame assembly MSA is used several times in the deposition process while the end of the first support stick ST1 is fixed to the accommodation portion APa by the second welding portion WP2, the end of the first support stick ST1 may be prevented from being separated from the support portion SP compared with a case where the end of the first support stick ST1 is fixed to only the ground bottom surface G-BS of the first step difference compensation portion AGC by the first welding portion WP1.

Referring to FIG. 8C, an accommodation portion APb may be provided with a first insertion hole AH1a defined therein. The first insertion hole AH1a may be formed through a support portion SP along a direction from an upper surface US of the support portion SP to a side surface of the support portion SP. Accordingly, as compared with the accommodation portion AP of FIG. 8A, the accommodation portion APb may have a structure in which the bottom surface FS (refer to FIG. 8A) and the accommodation groove AG (refer to FIG. 8A) are omitted. As the bottom surface FS and the accommodation groove AG are omitted, the second welding portion WP2 (refer to FIG. 8A) may also be omitted.

The first insertion hole AH1*a* may be defined by an inclination surface ISb and a middle surface MSa facing the inclination surface ISb in the first insertion hole AH1*a*. The inclination surface ISb may extend from a ground bottom surface G-BS of a step difference compensation portion AGC and may be inclined to a lower surface BS of the support portion SP. The middle surface MSa may extend from the upper surface US of the support portion SP and may be substantially parallel to the inclination surface ISb while being spaced apart from the inclination surface ISb. A distance between the inclination surface ISb and the middle surface MSa may be defined as a height IH1*a* of the first insertion hole AH1*a*. The height IH1*a* of the first insertion hole AH1*a* may be greater than a thickness of a first support stick ST1 and equal to or smaller than about five times of the thickness of the first support stick ST1 to allow the first support stick ST1 to be readily accommodated. FIG. 8C shows a structure in which the first support stick ST1 is disposed in the first insertion hole AH1*a*, however, the disclosure should not be limited thereto or thereby. In detail, the first support stick ST1 may include a portion withdrawn to the outside via the first insertion hole AH1*a*.

The end of the first support stick ST1 may be accommodated in the accommodation portion APb by only bending the end of the first support stick ST1 and inserting the end of the first support stick ST1 into the first insertion hole AH1*a*. Accordingly, a process of coupling the first support stick ST1 to the support portion SP may be simplified.

Figure 9:
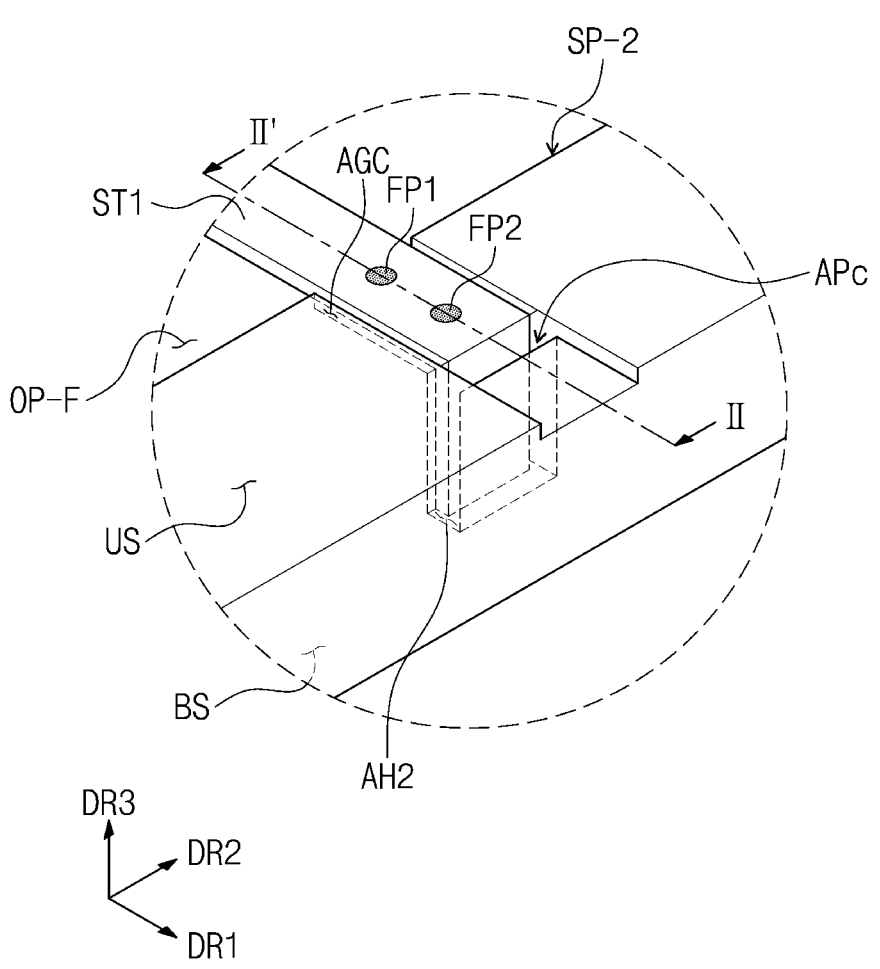
FIG. 9 is an enlarged schematic perspective view of a portion of a mask frame assembly according to an embodiment.
Figure 10A:
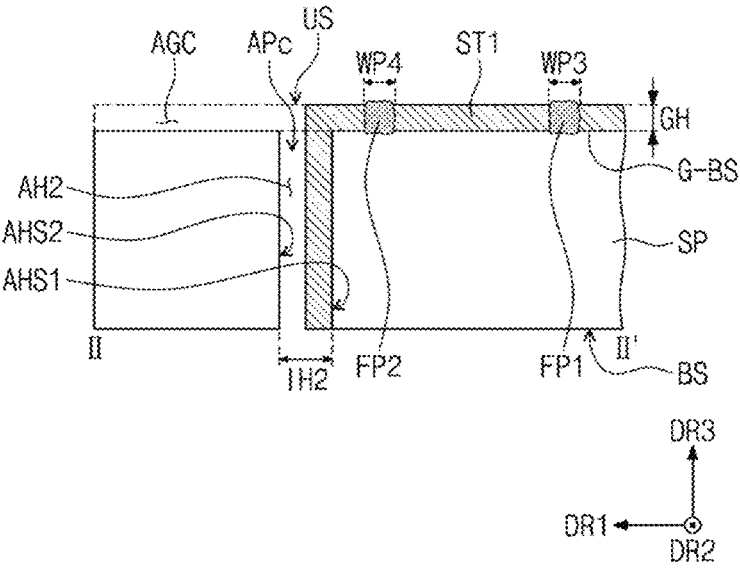
FIG. 10A is a schematic cross-sectional view of a mask frame assembly taken along line II-II' of FIG. 9 according to an embodiment.

FIG. 9 is an enlarged schematic perspective view of a portion of a mask frame assembly according to an embodiment. FIG. 10A is a schematic cross-sectional view of the mask frame assembly taken along line II-II' of FIG. 9 according to an embodiment.

Referring to FIGS. 6A, 9, and 10A, an end of a first support stick ST1 may be accommodated in an accommodation portion APc. The accommodation portion APc may include a second insertion hole AH2 defined through an upper surface US and a lower surface BS of a support portion SP.

The support portion SP may further include a step difference compensation portion AGC recessed from the upper surface US of the support portion SP. A portion of the first support stick ST1 may be placed in the step difference compensation portion AGC. A width in the second direction DR2 of the step difference compensation portion AGC may be substantially the same as a width in the second direction DR2 of the first support stick ST1, however, the disclosure should not be limited thereto or thereby. According to an embodiment, the width in the second direction DR2 of the step difference compensation portion AGC may be greater than the width in the second direction DR2 of the first support stick ST1 to allow the first support stick ST1 to be readily seated. A distance between the upper surface US of the support portion SP and a ground bottom surface G-BS of the step difference compensation portion AGC may be defined as a depth GH of the step difference compensation portion AGC. The depth GH of the step difference compensation portion AGC may be equal to or greater than the thickness of the first support stick ST1. The depth GH of the step difference compensation portion AGC may be uniform in the first direction DR1. As the first support stick ST1 is accommodated in the step difference compensation portion AGC, a mask MSK disposed on the first support stick ST1 may be coupled or connected with the upper surface US of the support portion SP by a welding process with no step difference therebetween.

The second insertion hole AH2 may be formed through the support portion SP from the upper surface US of the support portion SP to the lower surface BS of the support portion SP to secure a space in which the end of the first support stick ST1 is accommodated.

The support portion SP may contact (for example, directly contact) the first support stick ST1. The mask frame assembly MSA may further include first and second fixing portions FP1 and FP2 to fix the first support stick ST1 on the support portion SP. The first and second fixing portions FP1 and FP2 may be disposed between the accommodation portion APc and an opening OP-F and may fix the first support stick ST1 disposed on the support portion SP to a position. The first and second fixing portions FP1 and FP2 may include a separate fixing device to fix the first support stick ST1 to the support portion SP. In detail, the fixing device may include a magnet, a vacuum hole, and/or an electrostatic chuck (ESC). In the case where the fixing device is the magnet, the fixing device may be magnetically coupled or connected with the first support stick ST1 and may fix the first support stick ST1 on the support portion SP. In the case where the fixing device is the vacuum hole, the fixing device may fix the first support stick ST1 placed on the vacuum hole to the support portion SP with a vacuum pressure. In the case where the fixing device is the electrostatic chuck, the fixing device may fix the first support stick ST1 on the support portion SP with an electrostatic force. The second fixing portion FP2 may extend in the first direction DR1. The second fixing portion FP2 may be provided in plural.

The first and second fixing portions FP1 and FP2 disposed on the upper surface US of the support portion SP may include a third welding portion WP3 and a fourth welding portion WP4. The third and fourth welding portions WP3 and WP4 may be disposed between the accommodation portion APc and the opening OP-F of a frame body FM and may be spaced apart from each other in the first direction DR1. The third welding portion WP3 may be disposed closer to the opening OP-F than the fourth welding portion WP4 is, and thus, the fourth welding portion WP4 may be disposed closer to the accommodation portion APc than the third welding portion WP3 is. The third welding portion WP3 disposed relatively closer to the opening OP-F may fix the first support stick ST1 to the ground bottom surface G-BS of the step difference compensation portion AGC to allow the end of the first support stick ST1 to be readily accommodated in the second insertion hole AH2. The first support stick ST1 may be stably fixed to the accommodation portion APc by the fourth welding portion WP4. Accordingly, the end of the first support stick ST1 may be fixed to the accommodation portion APc while being inserted into the second insertion hole AH2. In a case where the mask frame assembly MSA is used several times in the deposition process while the end of the first support stick ST1 is fixed to the accommodation portion APc, the end of the first support stick ST1 may be prevented from being separated from the support portion SP compared with a case where the end of the first support stick ST1 is fixed on the support portion SP.

The second insertion hole AH2 may be formed to be vertical with respect to the upper surface US of the support portion SP in the third direction DR3, and the end of the first support stick ST1 may be bent to the lower surface BS of the support portion SP and may be inserted into the second insertion hole AH2. The second insertion hole AH2 may be defined by a first surface AHS1 closer to the opening OP-F of the frame body FM and a second surface AHS2 facing the first surface AHS1. The second surface AHS2 may be substantially parallel to the first surface AHS1. As an example, the first and second surfaces AHS1 and AHS2 may be substantially vertical to the upper surface US of the support portion SP, however, the disclosure should not be limited thereto or thereby. A distance between the first surface AHS1 and the second surface AHS2 may be defined as a height IH2 of the second insertion hole AH2. The height IH2 of the second insertion hole AH2 may be greater than a thickness of the first support stick ST1 and equal to or smaller than about five times of the thickness of the first support stick ST1 to allow the first support stick ST1 to be readily accommodated. FIG. 10A shows a structure in which the end of the first support stick ST1 is disposed in the second insertion hole AH2, however, the disclosure should not be limited thereto or thereby. In detail, the end of the first support stick ST1 may include a portion withdrawn to the outside via the second insertion hole AH2.

Figure 10B:
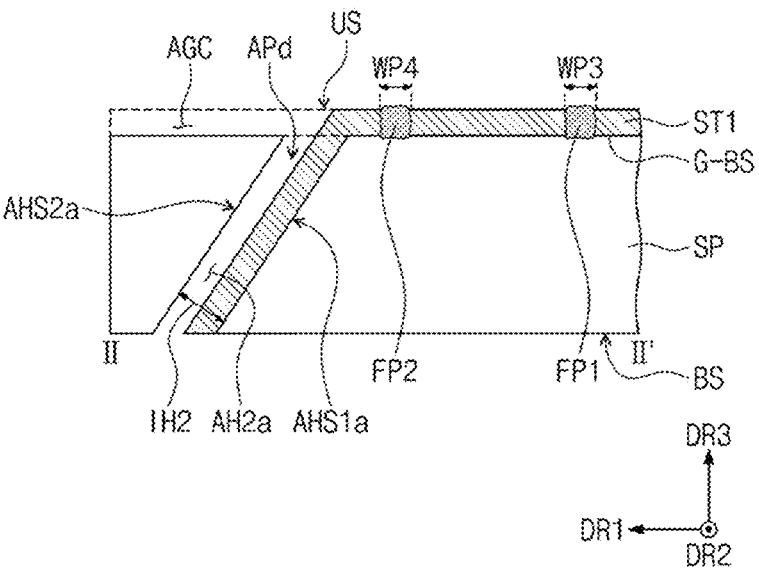
FIG. 10B is a schematic cross-sectional view of a mask frame assembly according to an embodiment.

FIG. 10B is a schematic cross-sectional view of a mask frame assembly according to an embodiment.

Referring to FIG. 10B, an accommodation portion APd may include a second insertion hole AH2*a* defined therein. Different from the second insertion hole AH2 of FIG. 10A, the second insertion hole AH2*a* may be formed to be inclined from a ground bottom surface G-BS to a lower surface BS of a step difference compensation portion AGC. The second insertion hole AH2*a* may be defined by a first surface AHS1*a* closer to an opening OP-F (refer to FIG. 6A) of a frame body FM (refer to FIG. 6A) and a second surface AHS2*a* facing the first surface AHS1*a* in the second insertion hole AH2*a*.

The first surface AHS1*a* may have a shape extending from the ground bottom surface G-BS of the step difference compensation portion AGC and inclined from an upper surface US to the lower surface BS. The first support stick ST1 may be disposed on the first surface AHS1*a*, and the first support stick ST1 may be adhered to the first surface AHS1*a*.

The second surface AHS2*a* may be formed substantially parallel to the first surface AHS1*a*. A distance between the first surface AHS1*a* and the second surface AHS2*a* may be defined as a height IH2 of the second insertion hole AH2*a*. The height IH2 of the second insertion hole AH2*a* may be greater than a thickness of the first support stick ST1 and equal to or smaller than about five times of the thickness of the first support stick ST1 to allow the first support stick ST1 to be readily accommodated.

FIGS. 11A to 11D are views of a method of manufacturing the mask frame assembly according to an embodiment.

Figure 11A:
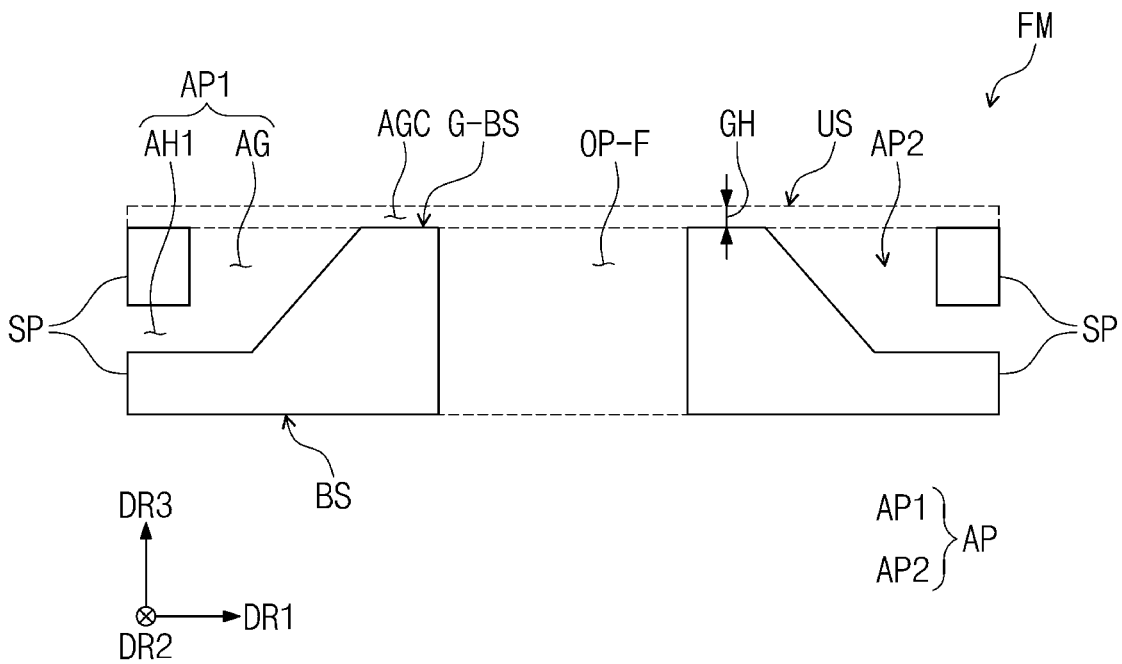
FIGS. 11A to 11D are views of a method of manufacturing a mask frame assembly according to an embodiment.

FIG. 11A is a schematic cross-sectional view of a process of placing the frame body FM. Referring to FIGS. 6A and 11A, the frame body FM may include the support portion SP and the opening OP-F. The support portion SP may support the masks MSK and may include the metal material, for example, nickel (Ni), nickel-cobalt alloy, or nickel-iron alloy. The opening OP-F may be defined through the frame body FM. The masks MSK may be exposed through the opening OP-F, and the opening OP-F may have the quadrangular shape according to the shape of the support portion SP when viewed in the plane.

The support portion SP may include the accommodation portion AP in which the support stick ST (refer to FIG. 6A) is accommodated and the step difference compensation portion AGC provided between the accommodation portion AP and the opening OP-F. The accommodation portion AP may include the first and second accommodation portions AP1 and AP2 disposed at the support portion SP and respectively accommodating both ends of the support stick. Each of the first and second accommodation portions AP1 and AP2 may include the accommodation groove AG recessed from the upper surface US of the support portion SP toward the lower surface BS of the support portion SP and the first insertion hole AH1 extending from the accommodation groove AG.

The first insertion hole AH1 may be formed through the support portion SP between the upper surface US and the lower surface BS of the support portion SP. The step difference compensation portion AGC may be recessed from the upper surface US of the support portion SP, and the portion of the first support stick ST1 (refer to FIG. 11B) may be seated in the step difference compensation portion AGC. The distance between the upper surface US of the support portion SP and the ground bottom surface G-BS of the step difference compensation portion AGC may be defined as the depth GH of the step difference compensation portion AGC. The depth GH of the step difference compensation portion AGC may be equal to or greater than the thickness of the first support stick ST1. The depth GH of the step difference compensation portion AGC may be uniform in the first direction DR1.

Figure 11B:
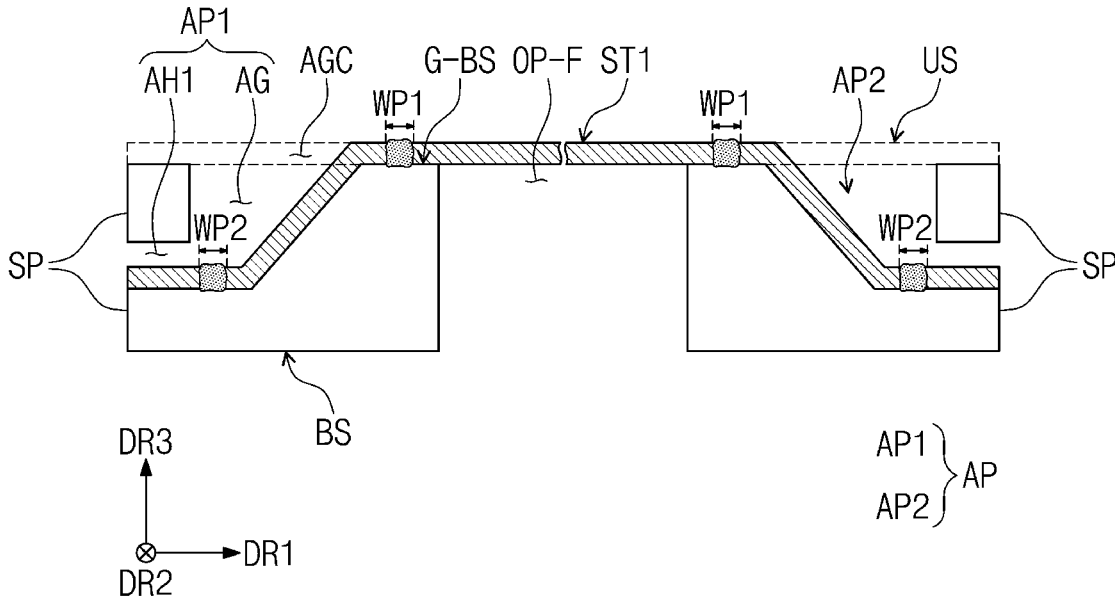

FIG. 11B is a schematic cross-sectional view of a process of placing the first support stick ST1 on the support portion SP and the opening OP-F. Referring to FIG. 11B, the first support stick ST1 may be disposed on the support portion SP and the opening OP-F, and both ends of the first support stick ST1 may be fixed to the support portion SP, for example, the step difference compensation portion AGC. As an example, the both ends of the first support stick ST1 may be accommodated in the first and second accommodation portions AP1 and AP2, respectively.

The both ends of the first support stick ST1 may be fixed to the ground bottom surface G-BS of the step difference compensation portion AGC by the first welding portion WP1 and may be fixed to the first and second accommodation portions AP1 and AP2 by the second welding portion WP2.

The process of accommodating the first support stick ST1 in the first and second accommodation portions AP1 and AP2 and the process of fixing the first support stick ST1 to the support portion SP and the first and second accommodation portions AP1 and AP2 will be described later.

Figure 11C:
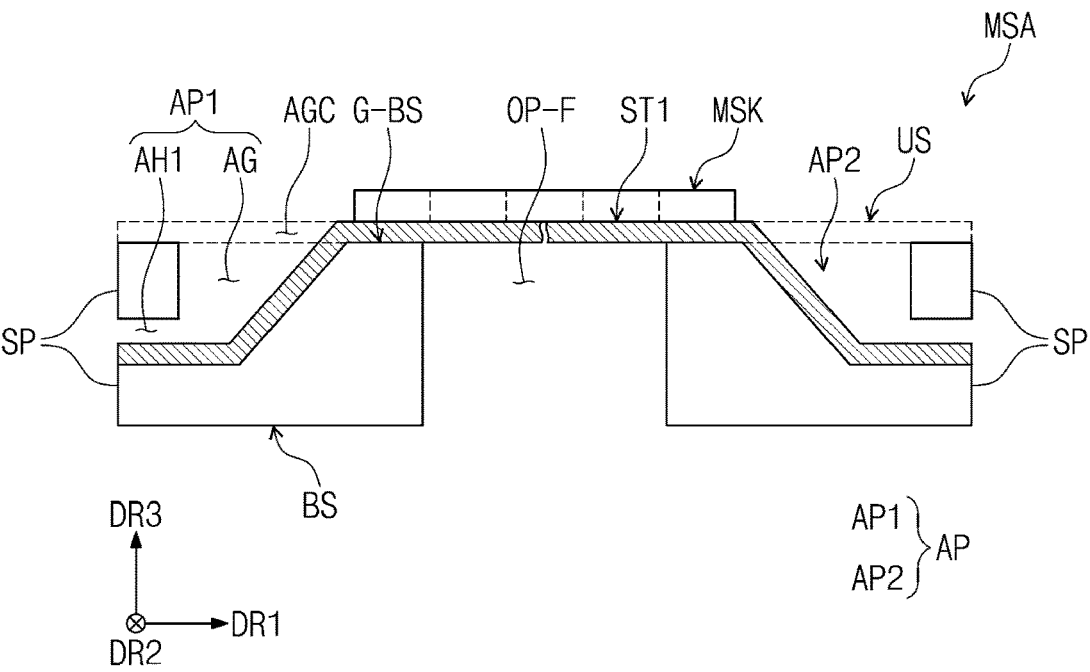
Figure 11D:
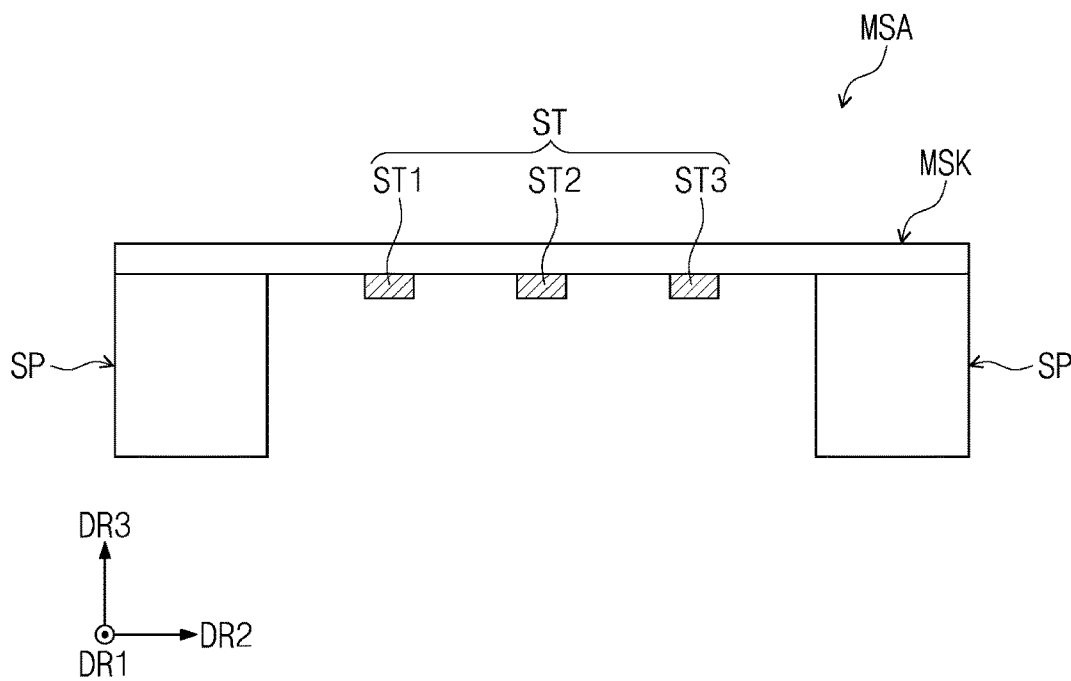

FIGS. 11C and 11D are schematic cross-sectional views of processes of placing the mask MSK on the frame body FM and the support stick ST. FIG. 11D is a schematic cross-sectional view of the mask frame assembly MSA when viewed in the second direction DR2 in the processes of placing the mask MSK on the frame body FM and the support stick ST.

Referring to FIGS. 11A, 11C, and 11D, the masks MSK may be disposed above the frame body FM and the support sticks ST. The masks MSK may be supported by the support portion SP of the frame body FM and the support stick ST, and a portion of the masks MSK may be exposed via the opening OP-F of the frame body FM.

The support portion SP of the frame body FM and the support sticks ST may be fixed by the welding process, and the masks MSK may be disposed on the support sticks ST. Accordingly, the masks MSK may be placed on the support sticks ST due to normal force by the support sticks ST.

The masks MSK may be coupled or connected with (for example, directly connected or coupled with) the support portion SP of the frame body FM by the welding process. In the manufacturing process of the mask frame assembly MSA, the masks MSK may be welded to the support portion SP while each of the masks MSK is being stretched in the second direction DR2.

In the an embodiment, the support sticks ST including three support sticks ST1, ST2, and ST3 are shown as a representative example, however, an embodiment should not be limited thereto or thereby. According to an embodiment, four or more support sticks ST may be employed. The support sticks ST may extend in the first direction DR1 and may be arranged or disposed spaced apart from each other in the second direction DR2 intersecting the first direction DR1.

FIGS. 12A to 12F are schematic cross-sectional views of a coupling process between the first support stick and the frame body according to an embodiment.

Figure 12A:
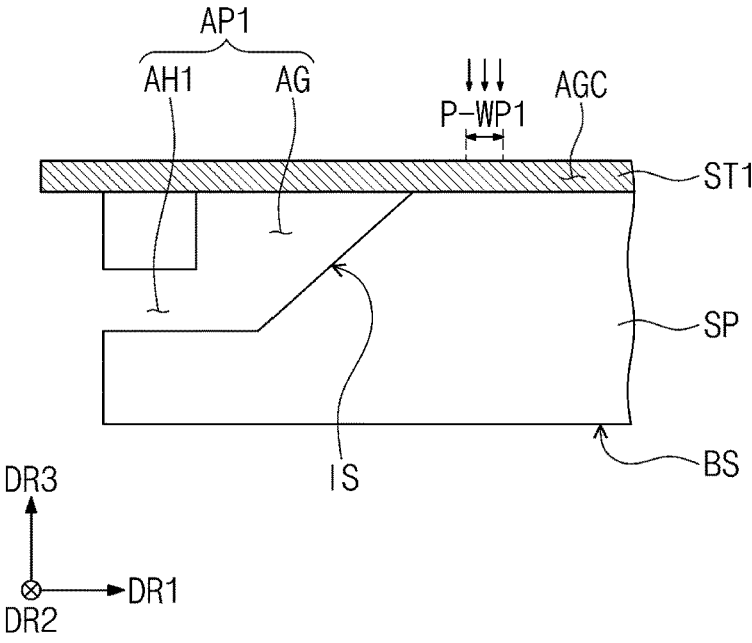
FIGS. 12A to 12F are schematic cross-sectional views of a coupling process between a support stick and a frame body according to an embodiment.

FIG. 12A is a schematic cross-sectional view of a process of fixing the first support stick ST1 on the support portion SP.

Referring to FIGS. 11B and 12A, when the first support stick ST1 is placed on the support portion SP, in particular, on the step difference compensation portion AGC, a first welding process may be performed in a first area P-WP1 between the first accommodation portion AP1 and the opening OP-F to fix the first support stick ST1. As an example, the first welding process may include irradiating a laser for welding to the first area P-WP1. When the laser for welding is irradiated, the first support stick ST1 may be melted by heat in the first area P-WP1, and the melted portion may be hardened and may be fixed to the support portion SP.

Figure 12B:
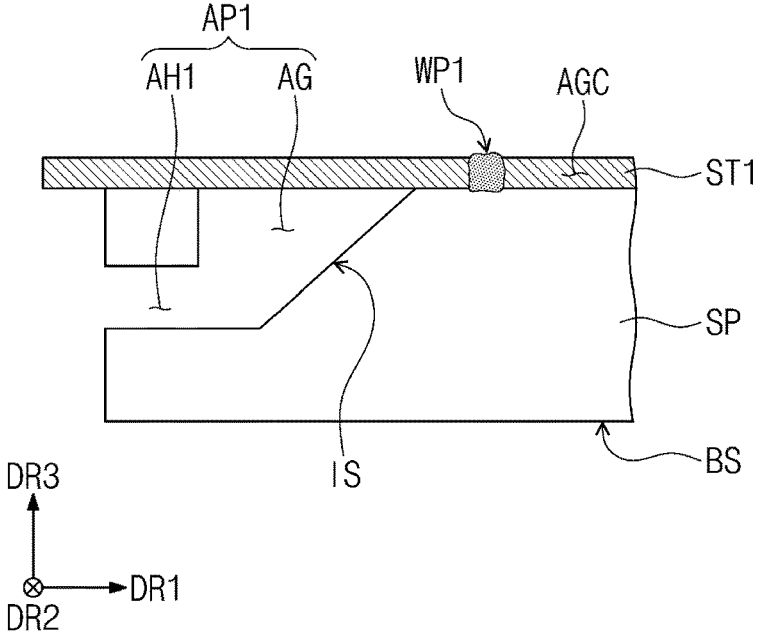

Referring to FIG. 12B, the first welding portion WP1 may be formed in the mask frame assembly MSA (refer to FIG. 11C) by the first welding process. Accordingly, the first support stick ST1 may be fixed to the support portion SP by the first welding portion WP1. However, the end of the first support stick ST1, which is placed on the outside with respect to the first welding portion WP1, may move freely in the third direction DR3.

Figure 12C:
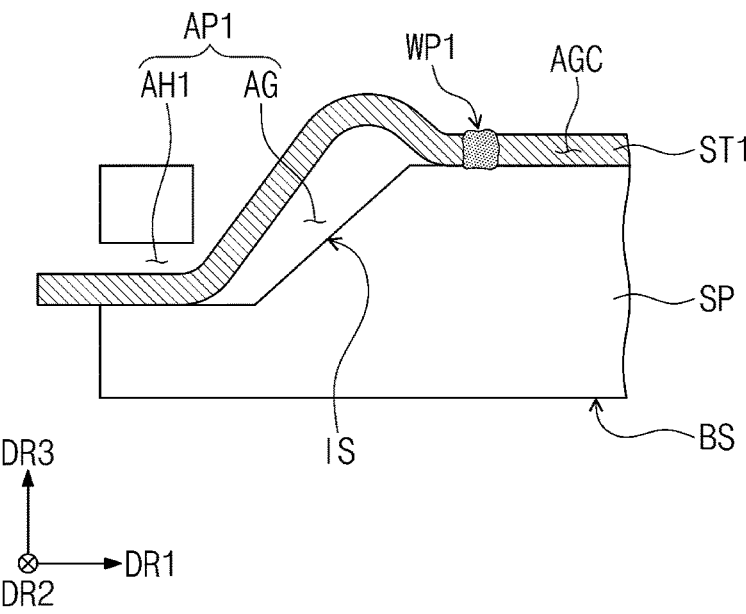

FIG. 12C is a schematic cross-sectional view of a process of coupling the end of the first support stick ST1 to the first accommodation portion AP1.

Referring to FIG. 12C, the end of the first support stick ST1 may be inserted into the first insertion hole AH1. In the process of inserting the end of the first support stick ST1 to the first insertion hole AH1, the first support stick ST1 may have a bent shape, and a series of operations of inserting the first support stick ST1 may be manually performed. Referring to FIG. 12C, the end of the first support stick ST1 may be withdrawn to the outside via the first insertion hole AH1, however, the disclosure should not be limited thereto or thereby. According to an embodiment, the end of the first support stick ST1 may not be withdrawn to the outside depending on the length of the first support stick ST1.

Figure 12D:
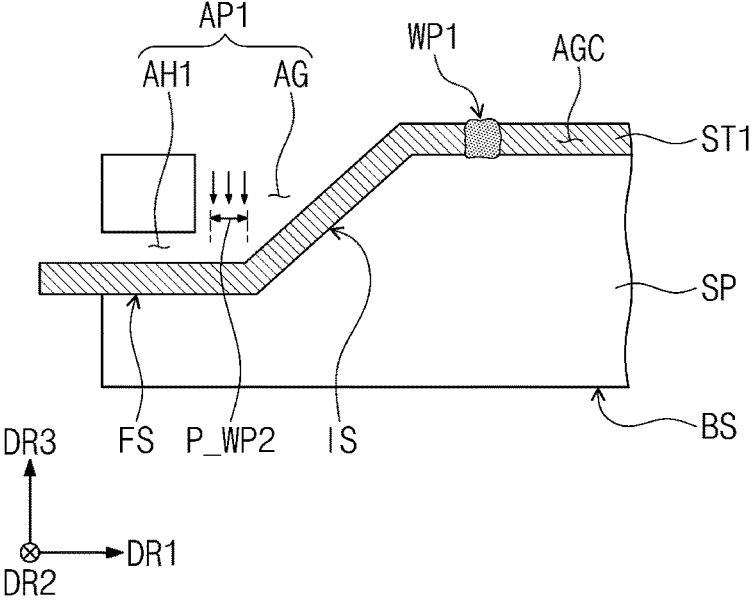
Figure 12E:
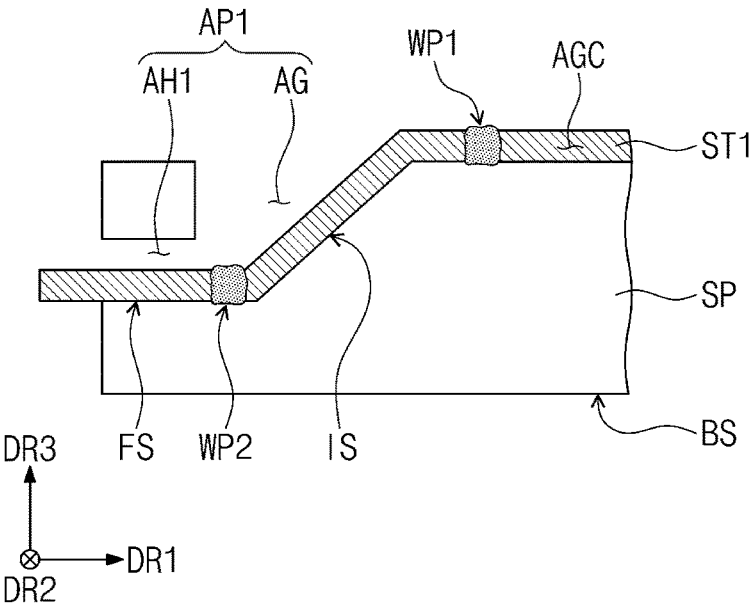

FIGS. 12D and 12E are schematic cross-sectional views of a process of fixing the first support stick ST1 to the bottom surface FS.

Referring to FIG. 12D, a second welding process may be performed in a second area P_WP2 defined in the first accommodation portion AP1 to fix the first support stick ST1 to the first accommodation portion AP1, for example, the bottom surface FS. As an example, the second welding process may include a process of irradiating a laser for welding to the second area P_WP2. The laser for welding used in the second welding process may be substantially the same as the laser for welding used in the first welding process. The first welding process and the second welding process may be performed under the same condition.

Referring to FIG. 12E, the second welding portion WP2 may be formed in the mask frame assembly MSA (refer to FIG. 11C) through the second welding process. The first support stick ST1 may be stably fixed to the first accommodation portion AP1 by the second welding portion WP2. Accordingly, the first support stick ST1 may be fixed to the first accommodation portion AP1 while the end of the first support stick ST1 is inserted into the first insertion hole AH1.

Before the second welding process is performed, a process of adhering or pressing the first support stick ST1 to the inclination surface IS may be further performed. The adhering or pressing process may be manually performed. In case that the end of the first support stick ST1 is inserted into the first insertion hole AH1, a distance may be generated between the inclination surface IS and the first support stick ST1. In case that the distance is generated between the inclination surface IS and the first support stick ST1, the first support stick ST1 may be separated from the inclination surface IS as the mask frame assembly MSA goes through several deposition and cleaning processes. It is possible to prevent the first support stick ST1 from being separated from the inclination surface IS by the adhering or pressing process.

Figure 12F:
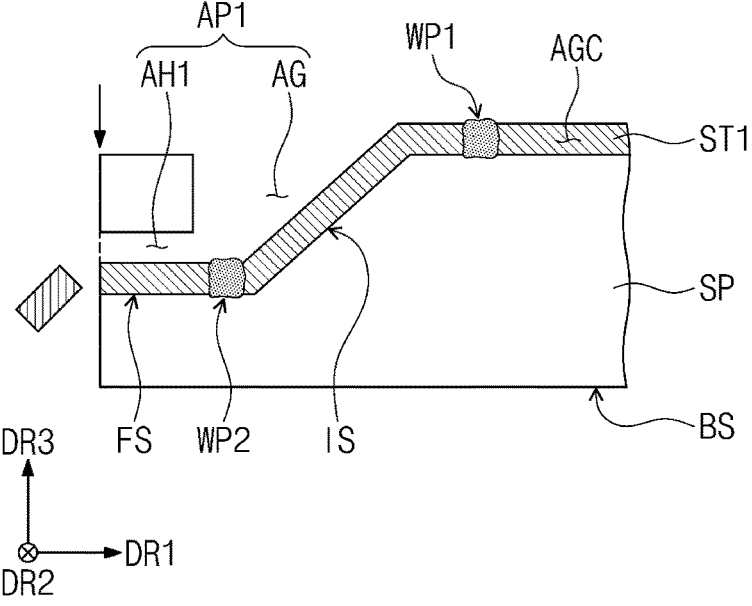

FIG. 12F is a schematic cross-sectional view of a process of cutting the portion of the first support stick ST1, which is withdrawn to the outside via the first insertion hole AH1.

Referring to FIG. 12F, the end of the first support stick ST1, which is withdrawn to the outside, may be cut using a cutting device, for example, a laser device. The cutting process may be performed in the case where the end of the first support stick ST1 is withdrawn to the outside via the first insertion hole AH1. As an example, in a case where the end of the first support stick ST1 is placed in the first insertion hole without being withdrawn to the outside, the cutting process may be omitted.

FIGS. 13A to 13F are schematic cross-sectional views of a coupling process between the support stick and the frame body according to an embodiment.

Figure 13A:
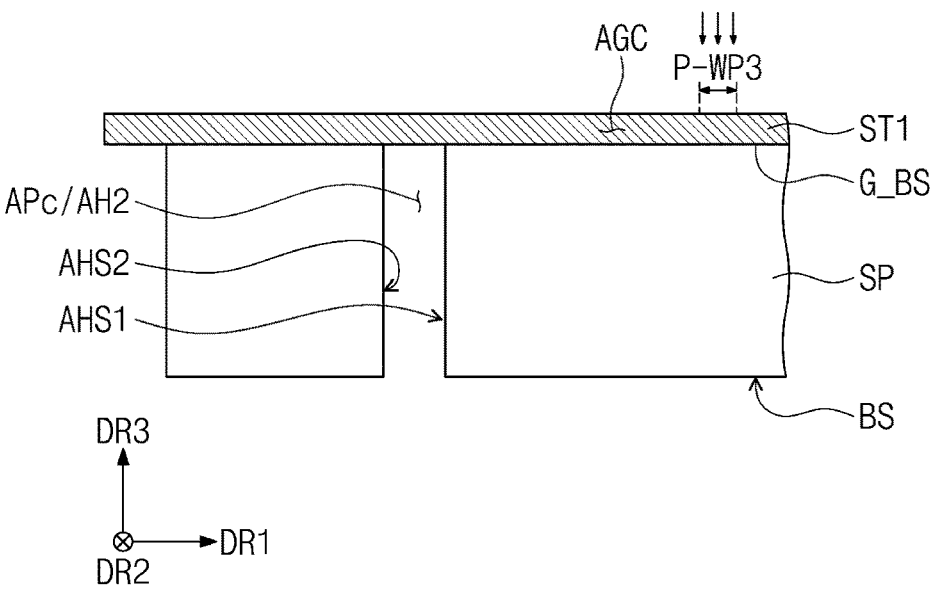
FIGS. 13A to 13F are schematic cross-sectional views of a coupling process between a support stick and a frame body according to an embodiment.

FIG. 13A is a schematic cross-sectional view of a process of primarily fixing the first support stick ST1 on the support portion SP.

Referring to FIG. 13A, in case that the first support stick ST1 is placed on the support portion SP (refer to FIG. 11A), for example, the step difference compensation portion AGC, a first welding process may be performed in a third area P-WP3 between the accommodation portion APc and the opening OP-F (refer to FIG. 11A) to fix the first support stick ST1. As an example, the first welding process may include a process of irradiating a laser for welding to the third area P-WP3. In case that the laser for welding is irradiated, the first support stick ST1 may be melted in the third area P-WP3, and the melted portion may be hardened and may be fixed to the support portion.

Figure 13B:
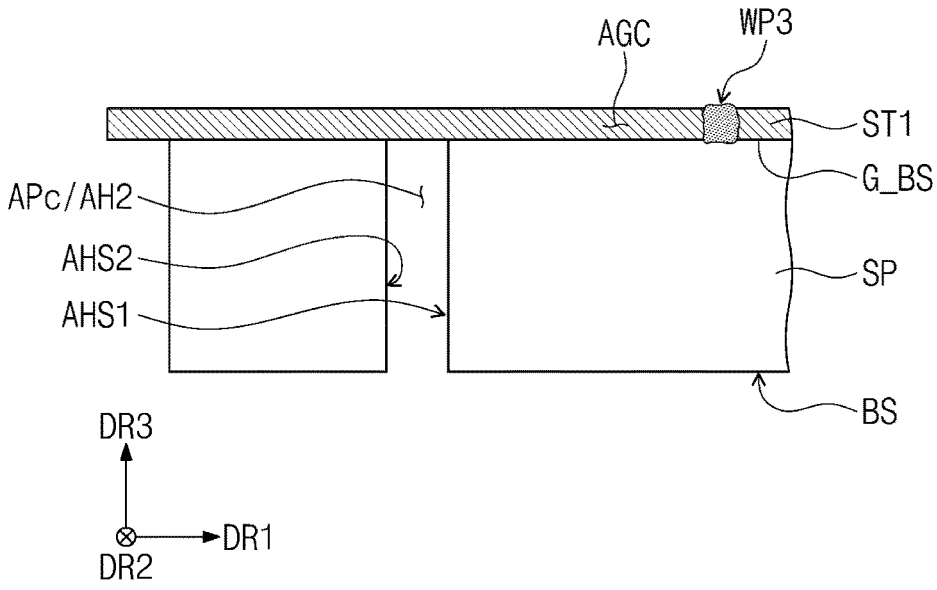

Referring to FIG. 13B, the third welding portion WP3 may be formed in the mask frame assembly MSA through the first welding process. Accordingly, the first support stick ST1 may be fixed to the support portion SP by the third welding portion WP3. However, the end of the first support stick ST1, which is placed on the outside with respect to the third welding portion WP3, may move freely in the third direction DR3.

Figure 13C:
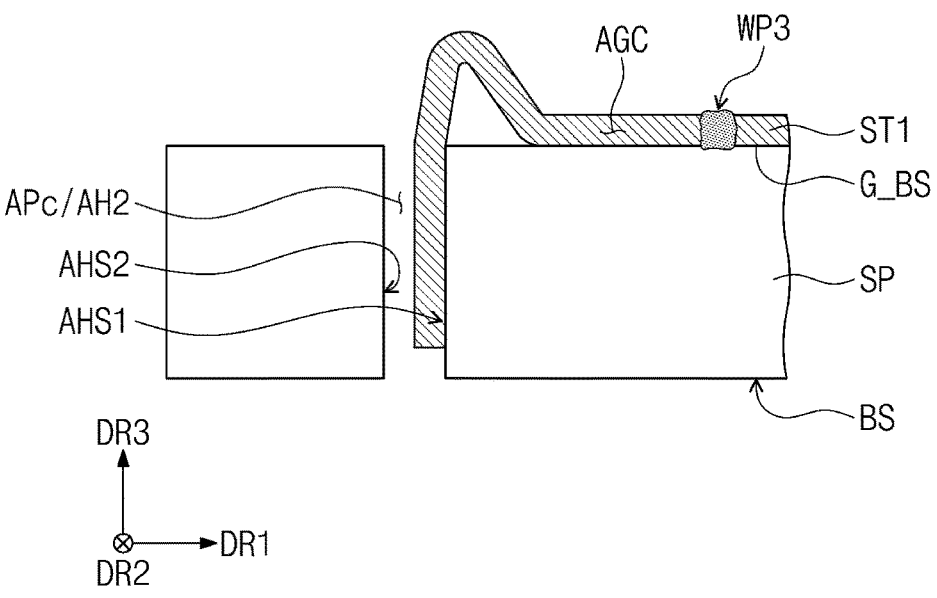

FIG. 13C is a schematic cross-sectional view of a process of coupling the end of the first support stick ST1 to the accommodation portion APc.

Referring to FIG. 13C, the end of the first support stick ST1 may be accommodated in the accommodation portion APc. Different from the first insertion hole AH1 of FIG. 12C, the second insertion hole AH2 may be formed through the support portion SP along the direction from the upper surface US to the lower surface BS of the support portion SP, and thus, the second insertion hole AH2 may be substantially the same as the accommodation portion APc. The second insertion hole AH2 may be defined by the first surface AHS1 closer to the opening OP-F (refer to FIG. 6A) of the frame body FM (refer to FIG. 6A) and the second surface AHS2 facing the first surface AHS1 in the second insertion hole AH2. The second surface AHS2 may be formed to be substantially parallel to the first surface AHS1.

In the process of inserting the end of the first support stick ST1 into the second insertion hole AH2, the first support stick ST1 may have a bent shape, and a series of operations of inserting the first support stick ST1 may be manually performed. Referring to FIG. 13C, the end of the first support stick ST1 may be withdrawn to the outside via the second insertion hole AH2, however, the disclosure should not be limited thereto or thereby. According to an embodiment, the end of the first support stick ST1 may not be withdrawn to the outside due to the length of the first support stick ST1.

Figure 13D:
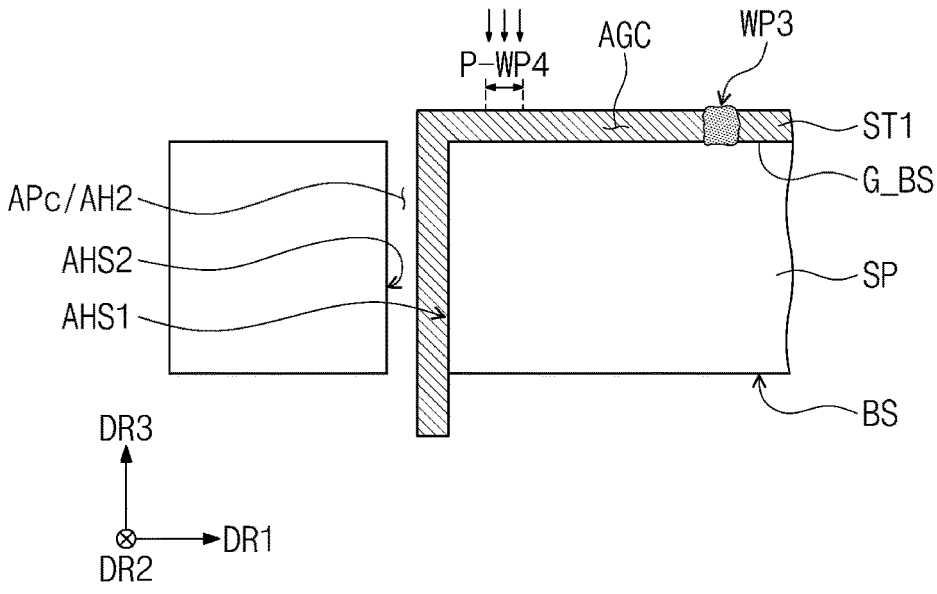
Figure 13E:
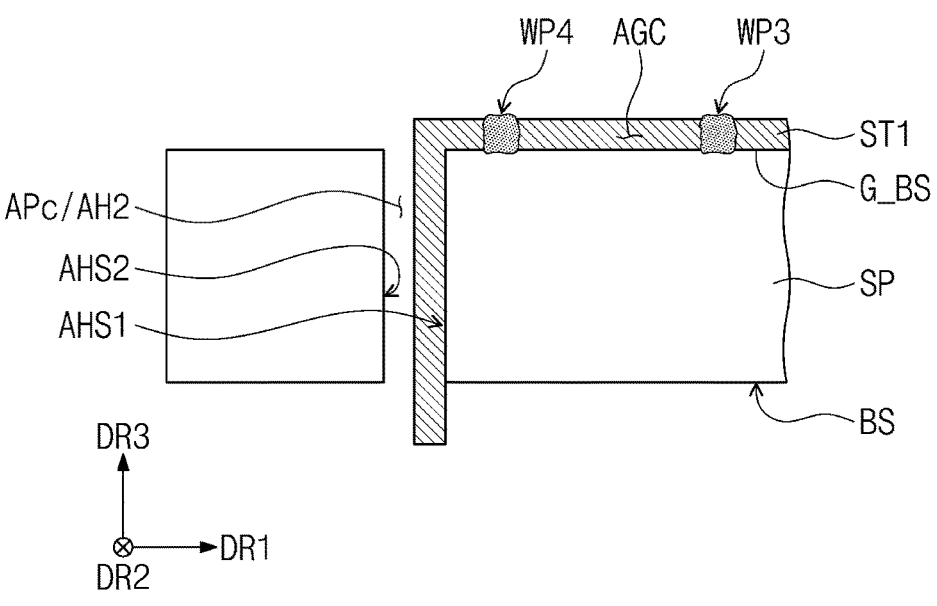

FIGS. 13D and 13E are schematic cross-sectional views of a process of secondarily fixing the first support stick ST1 to the ground bottom surface G-BS of the support portion SP.

Referring to FIG. 13D, a second welding process may be performed in a fourth area P-WP4 defined in the ground bottom surface G-BS of the support portion SP to fix the first support stick ST1 to the accommodation portion APc while the first support stick ST1 is being accommodated in the accommodation portion APc. The fourth area P-WP4 may be spaced apart from the third area P-WP3 in the first direction DR1 to be closer to the accommodation portion APa. As an example, the second welding process may include a process of irradiating a laser for welding to the fourth area P-WP4. The laser for welding used in the second welding process may be substantially the same as the laser for welding used in the first welding process. The first welding process and the second welding process may be performed under the same condition.

Referring to FIG. 13E, the fourth welding portion WP4 may be formed in the mask frame assembly MSA by the second welding process. The end of the first support stick ST1 may be fixed while being accommodated in the second insertion hole AH2 by the fourth welding portion WP4.

Before the second welding process is performed, a process of adhering or pressing the first support stick ST1 to the ground bottom surface G-BS of the support portion SP may be further performed. The adhering or pressing process may be manually performed. In case that the end of the first support stick ST1 is inserted into the second insertion hole AH2, a distance may be generated between the ground bottom surface G-BS of the support portion SP and the first support stick ST1. In case that the distance is generated between the ground bottom surface G-BS of the support portion SP and the first support stick ST1, the ground bottom surface G-BS of the support portion SP and the first support stick ST1 may be detached as the mask frame assembly MSA goes through several deposition and cleaning processes. It is possible to prevent the first support stick ST1 from being separated from the ground bottom surface G-BS by the adhering or pressing process.

Figure 13F:
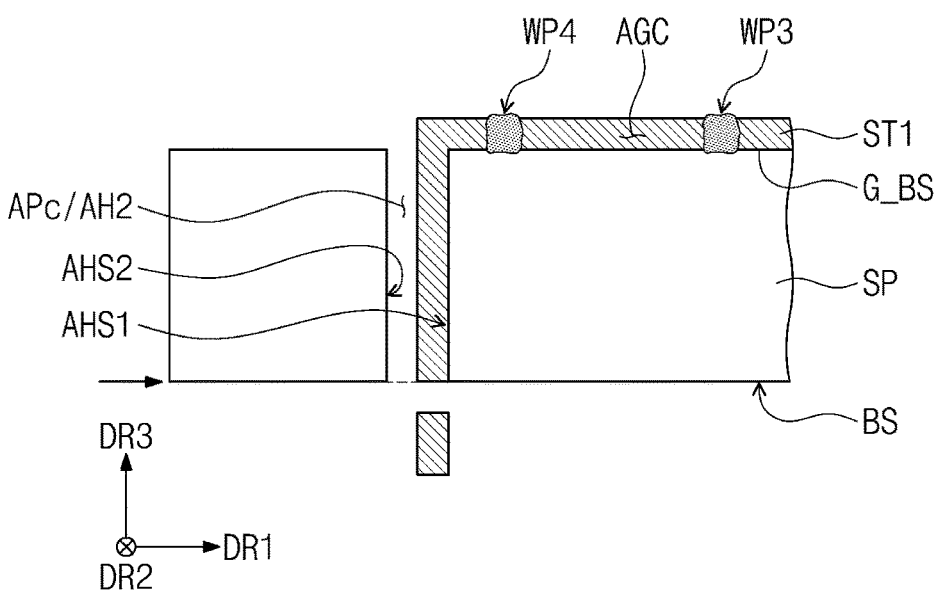

FIG. 13F is a schematic cross-sectional view of a process of cutting the portion of the first support stick ST1, which is withdrawn to the outside via the second insertion hole AH2.

Referring to FIG. 13F, the end of the first support stick ST1, which is withdrawn to the outside, may be cut using a cutting device, for example, a laser device. The cutting process may be performed in the case where the end of the first support stick ST1 is withdrawn to the outside via the second insertion hole AH2. As an example, in a case where the end of the first support stick ST1 is placed in the second insertion hole AH2 without being withdrawn to the outside, the cutting process may be omitted.

Although the embodiments have been described, it is understood that the disclosure should not be limited to these embodiments but various changes and modifications can be made by one of ordinary skill in the art within the spirit and scope of the disclosure and as hereinafter claimed.

Therefore, the disclosed subject matter should not be limited to any single embodiment described herein, and the scope of the disclosure shall be determined according to the attached claims.

What is claimed is:

1. A mask frame assembly comprising:
a mask;
a frame body comprising a support portion supporting the mask and including an opening through which the mask is exposed;
at least one support stick disposed in the support portion of the frame body and supporting the mask in the opening of the frame body; and
a fixing portion connecting the at least one support stick to the support portion, wherein
the support portion comprises a step difference compensation portion recessed from an upper surface of the support portion and an accommodation portion recessed from the step difference compensation portion,
the fixing portion is disposed on a ground bottom surface of the step difference compensation portion,
the accommodation portion comprises an accommodation surface that is inclined from the ground bottom surface or substantially vertical to the ground bottom surface,
wherein the support stick is in direct contact with the ground bottom surface of the step difference compensation portion and disposed on the accommodating portion and in direct contact with the accommodation surface.

2. The mask frame assembly of claim 1, wherein the at least one accommodation portion comprises an accommodation groove recessed from the upper surface of the support portion toward a lower surface of the support portion and accommodating the end of the at least one support stick.

3. The mask frame assembly of claim 2, wherein
the at least one accommodation portion includes a first insertion hole extending from the accommodation groove and defined through the support portion between the upper surface and the lower surface of the support portion, and
the end of the at least one support stick is inserted into the first insertion hole of the at least one accommodation portion.

4. A mask frame assembly comprising:
a mask;
a frame body comprising a support portion supporting the mask and including an opening through which the mask is exposed;
at least one support stick disposed in the support portion of the frame body and supporting the mask in the opening of the frame body; and a fixing portion connecting the at least one support stick to the support portion, wherein the support portion comprises at least one accommodation portion in which an end of the at least one support stick is accommodated, and the fixing portion is disposed between the at least one accommodation portion and the opening of the frame body, wherein the at least one accommodation portion comprises an accommodation groove recessed from an upper surface of the support portion toward a lower surface of the support portion and accommodating the end of the at least one support stick, the at least one accommodation portion includes a first insertion hole extending from the accommodation groove and defined through the support portion between the upper surface and the lower surface of the support portion, the end of the at least one support stick is inserted into the first insertion hole of the at least one accommodation portion, the support portion comprises a step difference compensation portion recessed from the upper surface of the support portion, a portion of the at least one support stick is disposed in the step difference compensation portion, and the at least one accommodation portion comprises:

an inclination surface defining the accommodation groove and inclined from a ground bottom surface of the step difference compensation portion toward the lower surface; and a bottom surface extending from the inclination surface to a direction substantially parallel to the lower surface and defining the first insertion hole of the at least one accommodation portion.

5. The mask frame assembly of claim 4, wherein the fixing portion comprises a first welding portion, and the first welding portion is disposed on the ground bottom surface of the step difference compensation portion and does not overlap the at least one accommodation portion in the plane.

6. The mask frame assembly of claim 5, wherein the at least one accommodation portion comprises a second welding portion that connects the at least one support stick to the at least one accommodation portion, and the second welding portion is disposed on the bottom surface and does not overlap the first insertion hole of the at least one accommodation portion in the plane.

7. The mask frame assembly of claim 4, wherein the first insertion hole is defined by the bottom surface and a middle surface facing the bottom surface, and a distance between the bottom surface and the middle surface is greater than a thickness of the at least one support stick and equal to or less than about five times the thickness of the at least one support stick.

8. A mask frame assembly comprising:

a mask;

a frame body comprising a support portion supporting the mask and including an opening through which the mask is exposed;

at least one support stick disposed in the support portion of the frame body and supporting the mask in the opening of the frame body; and a fixing portion connecting the at least one support stick to the support portion, wherein the support portion comprises at least one accommodation portion in which an end of the at least one support stick is accommodated, the fixing portion is disposed between the at least one accommodation portion and the opening of the frame body, the at least one accommodation portion includes a second insertion hole defined through an upper surface of the support portion and a lower surface of the support portion, and the end of the at least one support stick is bent toward the lower surface of the support portion in the at least one accommodation portion and inserted into the second insertion hole of the at least one accommodation portion.

9. The mask frame assembly of claim 8, wherein the second insertion hole is substantially vertical to the upper surface of the support portion.

10. The mask frame assembly of claim 8, wherein the fixing portion comprises a third welding portion and a fourth welding portion, the third welding portion and the fourth welding portion are disposed on the support portion, and the third welding portion and the fourth welding portion are disposed between the at least one accommodation portion and the opening and spaced apart from each other in a direction in which the at least one support stick extends.

11. The mask frame assembly of claim 1, wherein the at least one support stick extends in a first direction, and the at least one accommodation portion comprises:

a first accommodation portion accommodating a first end of both ends of the at least one support stick; and a second accommodation portion accommodating a second end of the both ends of the at least one support stick.

12. The mask frame assembly of claim 11, wherein the at least one support stick includes support sticks, and the support sticks are spaced apart from each other in a second direction intersecting the first direction.

13. The mask frame assembly of claim 12, wherein the at least one accommodation portion includes accommodation portions, and the accommodation portions are spaced apart from each other in the second direction and respectively correspond to the support sticks to accommodate the support sticks, respectively.

14. A method of manufacturing the mask frame assembly of claim 1, comprising:

placing the frame body comprising support portion and the opening;

placing the at least one support stick on the support portion and the opening;

connecting the support stick to the support portion; and placing the mask on the frame body and the support stick, the mask being supported by the support portion and being exposed through the opening, the support portion comprising the accommodation portion accommodating the end of the support stick, wherein the connecting of the support stick comprises:

connecting the support stick to the support portion using a fixing portion; and connecting the end of the support stick to the accommodation portion.

15. The method of claim 14, wherein the accommodation portion comprises:

an accommodation groove recessed from the upper surface of the support portion toward a lower surface of the support portion and accommodating a portion of the support stick; and a first insertion hole extending from the accommodation groove and defined through the support portion between the upper surface and the lower surface of the support portion, and the end of the support stick is inserted into the first insertion hole of the accommodation portion.

16. The method of claim 15, wherein the support portion comprises a step difference compensation portion recessed from the upper surface of the support portion, a portion of the support stick is disposed in the step difference compensation portion, the accommodation surface is an inclination surface defining the accommodation groove and inclined from a ground bottom surface of the step difference compensation portion toward the lower surface; and the accommodation portion comprises a bottom surface extending from the inclination surface to a direction substantially parallel to the lower surface and defining the first insertion hole of the accommodation portion.

17. The method of claim 16, wherein the connecting of the support stick to the support portion using the fixing portion comprises forming the fixing portion through a first welding process.

18. The method of claim 16, wherein the connecting of the end of the support stick to the accommodation portion comprises:

inserting the end into the first insertion hole; and connecting the support stick to the bottom surface through a second welding process.

19. The method of claim 18, further comprising:

cutting a portion of the support stick which is outside of the support portion by the first insertion hole of the accommodation portion.

20. The method of claim 15, wherein the accommodation portion includes a second insertion hole defined through the upper surface and the lower surface of the support portion, and the connecting of the end of the support stick to the accommodation portion comprises inserting the end of the support stick into the second insertion hole of the accommodation portion.

21. The method of claim 20, wherein the connecting of the support stick to the support portion using the fixing portion comprises:

forming a first fixing portion that connects the support stick through a first welding process before the connecting of the end of the support stick to the accommodation portion; and forming a second fixing portion that connects the support stick through a second welding process after the connecting of the end of the support stick to the accommodation portion.

22. The method of claim 20, further comprising:

cutting a portion of the support stick which is outside of the support portion by the second insertion hole of the accommodation portion.

* * * * *